(12) United States Patent
Shin et al.

(10) Patent No.: US 11,194,579 B2
(45) Date of Patent: Dec. 7, 2021

(54) MEMORY DEVICE SUPPORTING SKIP CALCULATION MODE AND METHOD OF OPERATING THE SAME

(71) Applicant: Samsung Electronics Co., Ltd., Suwon-si (KR)

(72) Inventors: Hyun-Sung Shin, Seoul (KR);
Sung-Ho Park, Hwaseong-si (KR);
Chan-Kyung Kim, Hwaseong-si (KR);
Yong-Sik Park, Anyang-si (KR);
Sang-Hoon Shin, Goyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 165 days.

(21) Appl. No.: 16/199,679

(22) Filed: Nov. 26, 2018

(65) Prior Publication Data
US 2019/0258487 A1    Aug. 22, 2019

(30) Foreign Application Priority Data
Feb. 21, 2018   (KR) ........................ 10-2018-0020422

(51) Int. Cl.
| | | |
|---|---|---|
| G06F 9/355 | (2018.01) | |
| G06F 9/30 | (2018.01) | |
| G06F 9/345 | (2018.01) | |
| G06F 12/0815 | (2016.01) | |

(52) U.S. Cl.
CPC .......... *G06F 9/355* (2013.01); *G06F 9/30029* (2013.01); *G06F 9/30043* (2013.01); *G06F 9/345* (2013.01); *G06F 12/0815* (2013.01)

(58) Field of Classification Search
CPC .. G06F 9/355; G06F 9/30043; G06F 9/30029; G06F 9/345; G06F 12/0815; G06F 12/0877

See application file for complete search history.

(56) References Cited

U.S. PATENT DOCUMENTS

| | | |
|---|---|---|
| 7,167,890 B2 | 1/2007 | Lin et al. |
| 8,583,898 B2 | 11/2013 | Greyzck |
| 9,606,807 B2 | 3/2017 | Walker |
| 9,720,663 B2 | 8/2017 | Rong et al. |

(Continued)

OTHER PUBLICATIONS

IBM, "Cache Invalidate Filtering with Residence Approximation", IBM Technical Disclosure Bulletin (Year: 1993).*

*Primary Examiner* — Kalpit Parikh
(74) *Attorney, Agent, or Firm* — Harness, Dickey & Pierce, P.L.C.

(57) ABSTRACT

A memory device includes a memory cell array formed in a semiconductor die, the memory cell array including a plurality of memory cells to store data and a calculation circuit formed in the semiconductor die. The calculation circuit performs calculations based on broadcast data and internal data and omits the calculations with respect to invalid data and performs the calculations with respect to valid data based on index data in a skip calculation mode, where the broadcast data are provided from outside the semiconductor die, the internal data are read from the memory cell array, and the index data indicates whether the internal data are the valid data or the invalid data. Power consumption is reduced by omitting the calculations and the read operation with respect to the invalid data through the skip calculation mode based on the index data.

19 Claims, 22 Drawing Sheets

(56) References Cited

U.S. PATENT DOCUMENTS

| | | | |
|---|---|---|---|
| 2006/0224839 A1* | 10/2006 | Blumrich | G06F 12/0831 |
| | | | 711/146 |
| 2012/0221785 A1* | 8/2012 | Chung | G11C 7/1006 |
| | | | 711/105 |
| 2015/0379054 A1 | 12/2015 | Kernert et al. | |
| 2016/0147827 A1 | 5/2016 | Diaconu et al. | |
| 2017/0147608 A1 | 5/2017 | Zhang | |
| 2017/0177346 A1 | 6/2017 | Gokhale et al. | |

* cited by examiner

FIG. 7B

MEMORY DEVICE SUPPORTING SKIP CALCULATION MODE AND METHOD OF OPERATING THE SAME

CROSS-REFERENCE TO RELATED APPLICATION

This U.S. Non-provisional application claims priority under 35 USC § 119 to Korean Patent Application No. 10-2018-0020422, filed on Feb. 21, 2018, in the Korean Intellectual Property Office (KIPO), the disclosure of which is incorporated by reference in its entirety herein.

BACKGROUND

1. Technical Field

Example embodiments relate generally to semiconductor integrated circuits. For example, at least some example embodiments relate to a memory device supporting a skip calculation mode and/or a method of operating a memory device.

2. Discussion of the Related Art

Memory bandwidth and latency are performance bottlenecks in many processing systems. Memory capacity may be increased through the use of a stacked memory device in which a plurality of semiconductor devices are stacked in a package of a memory chip. The stacked semiconductor dies may be electrically connected through the use of through-silicon vias or through-substrate vias (TSVs). Such stacking technology may increase memory capacity and also suppress bandwidth and latency penalties. Each access of an external device to the stacked memory device involves data communication between the stacked semiconductor dies. In this case, inter-device bandwidth and inter-device latency penalties may occur twice for each access. Accordingly, the inter-device bandwidth and inter-device latency may have a significant impact on processing efficiency and power consumption of the system when a task of the external device requires multiple accesses to the stacked memory device.

SUMMARY

Some example embodiments may provide a memory device and/or a method of operating a memory device capable of efficiently performing a processing in memory (PIM) efficiently.

According to example embodiments, a memory device includes a memory cell array associated with a semiconductor die, the memory cell array including a plurality of memory cells configured to store data; and processing circuitry associated with the semiconductor die, the processing circuitry configured to selectively perform calculations on broadcast data and internal data in a skip calculation mode based on whether index data indicates that the internal data is invalid data or valid data, the broadcast data being provided from outside the semiconductor die, the internal data being read from the memory cell array.

According to example embodiments, a memory device includes a plurality of memory semiconductor dies stacked in a vertical direction; through-silicon vias electrically connecting the plurality of memory semiconductor dies; a plurality of memory integrated circuits (ICs) associated with respective ones of the plurality of memory semiconductor dies, the plurality of memory ICs configured to store data; and processing circuitry associated with one or more calculation semiconductor dies among the plurality of memory semiconductor dies, the processing circuitry configured to selectively perform calculations based on broadcast data and internal data in a skip calculation mode based on whether index data indicates that the internal data is invalid data or valid data, the broadcast data being provided commonly to the calculation semiconductor dies through the through-silicon vias, the internal data being read respectively from the plurality of memory integrated circuits.

According to example embodiments, a method of operating a memory device, the memory device including a semiconductor die having a memory cell array and processing circuitry associated therewith. In some example embodiments, the method includes receiving index data indicating whether internal data are valid data or invalid data in a skip calculation mode; and selectively performing, via the processing circuitry, calculations on broadcast data and the internal data in the skip calculation mode based on whether the index data indicates that the internal data is the invalid data or the valid data, the broadcast data being provided from outside the semiconductor die, the internal data being read from the memory cell array.

The memory device and the method of operating the memory device according to example embodiments may reduce power consumption by omitting the calculations and the read operation with respect to the invalid data through the skip calculation mode based on the index data.

BRIEF DESCRIPTION OF THE DRAWINGS

Example embodiments of the present disclosure will be more clearly understood from the following detailed description taken in conjunction with the accompanying drawings.

FIGS. 7A and 7B are diagrams for describing index data according to example embodiments.

DETAILED DESCRIPTION

Figure 1:
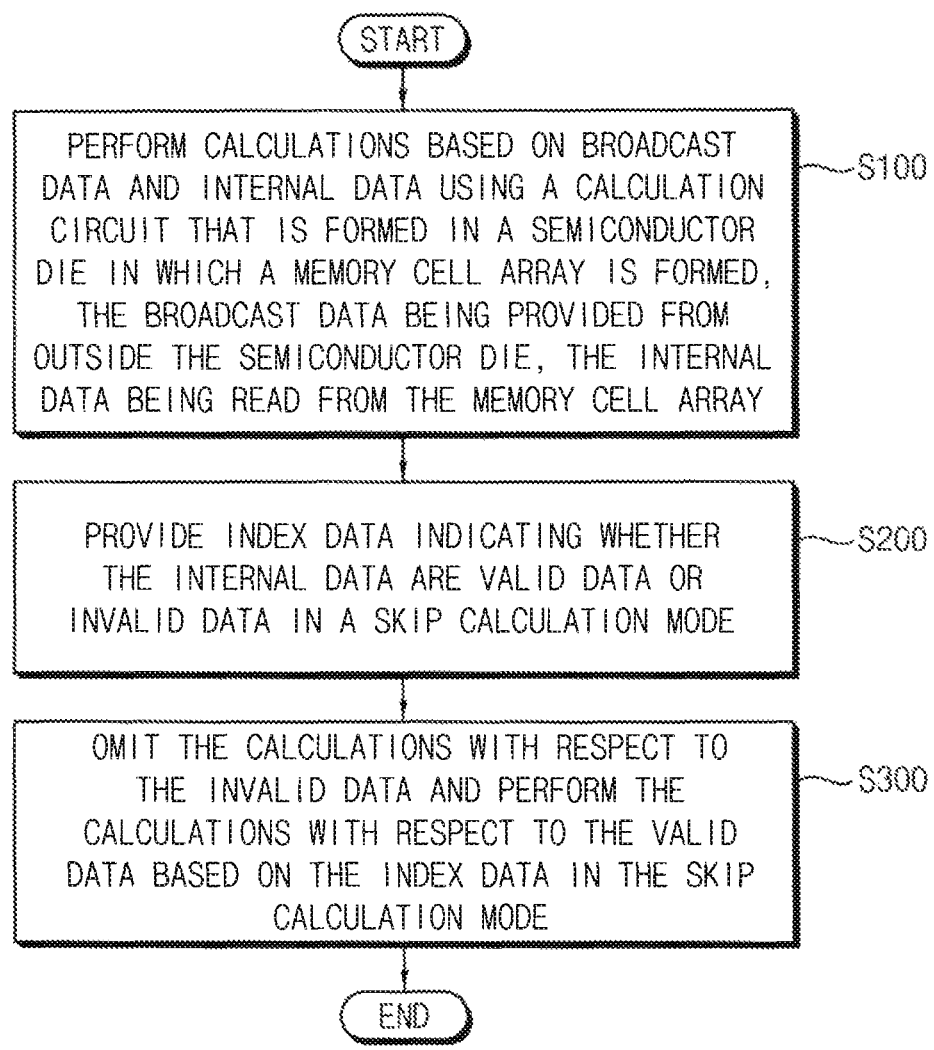
FIG. 1 is a flow chart illustrating a method of operating a memory device according to example embodiments.

Various example embodiments will be described more fully hereinafter with reference to the accompanying drawings, in which some example embodiments are shown. In the drawings, like numerals refer to like elements throughout. The repeated descriptions may be omitted.

FIG. 1 is a flow chart illustrating a method of operating a memory device according to example embodiments.

Referring to FIG. 1, in operation S100, a calculation circuit may perform calculations based on broadcast data and internal data. The calculation circuit may be formed in a semiconductor die in which a memory cell array is formed. The broadcast data may be provided from outside the semiconductor die and the internal data may be read from the memory cell array.

In operation S200, in a skip calculation mode, index data indicating whether the internal data are valid data or invalid data in a skip calculation mode are provided.

In operation S300, the calculations with respect to the invalid data are omitted and the calculations with respect to the valid data are performed based on the index data in the skip calculation mode.

As such, the method of operating a stacked memory device according to example embodiments may reduce power consumption by omitting the calculations and the read operation with respect to the invalid data through the skip calculation mode based on the index data.

Figure 2:
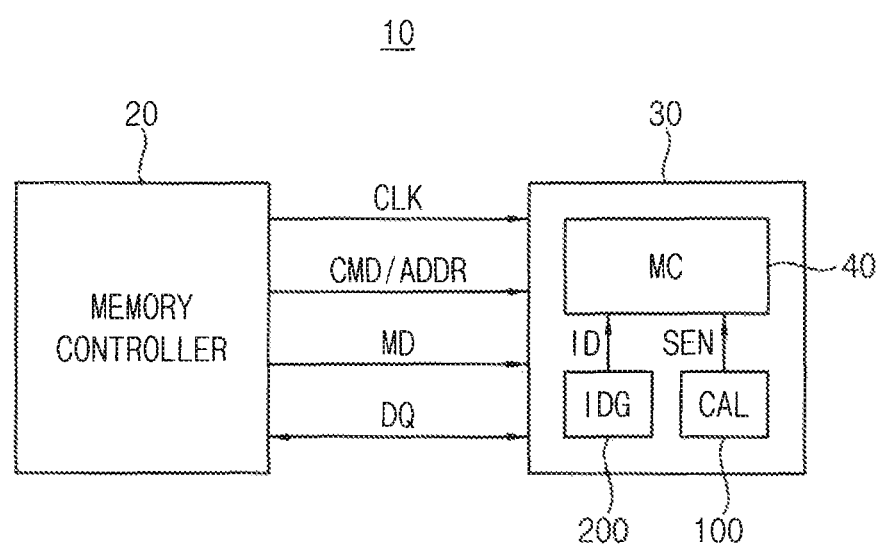
FIG. 2 is a block diagram illustrating a memory system including a memory device according to example embodiments.

FIG. 2 is a block diagram illustrating a memory system including a memory device according to example embodiments.

Referring to FIG. 2, a memory system 10 may include a memory controller 20 and a semiconductor memory device 30.

The memory controller 20 may control the overall operation of the memory system 10. The memory controller 20 may control the overall data exchange between an external host and the semiconductor memory device 30. For example, the memory controller 20 may write data in the semiconductor memory device 30 or read data from the semiconductor memory device 30 in response to a request from the host. In addition, the memory controller 20 may issue operation commands to the semiconductor memory device 30 for controlling the semiconductor memory device 30.

In some example embodiments, the semiconductor memory device 30 may be a memory device including dynamic memory cells such as a dynamic random access memory (DRAM), double data rate 4 (DDR4) synchronous DRAM (SDRAM), a low power DDR4 (LPDDR4) SDRAM or a LPDDR5 SDRAM.

The memory controller 20 may transmit a clock signal CLK, a command CMD and an address (signal) ADDR to the semiconductor memory device 30 and exchange data DQ with the semiconductor memory device 30. In addition, the memory controller 20 may provide a mode signal MD indicating a skip calculation mode or a normal calculation mode as will be described below to the semiconductor memory device 30. The mode signal MD may be provided as a control signal or may be provided through a mode register write command for setting a mode register in the semiconductor memory device 30.

The semiconductor memory device 30 may include a memory cell array MC 40, a calculation circuit CAL 100 and an index data generator IDG 200.

The memory cell array 40 may include a plurality of memory cells to store data. The memory cells may be grouped into a plurality of memory banks and each memory bank may include a plurality of data blocks.

The calculation circuit 100 may be formed in a semiconductor die in which the memory cell array 40 are formed. The calculation circuit 100 may perform calculations based on broadcast data and internal data where the broadcast data are provided from outside the semiconductor die and the internal data are read from the memory cell array. The calculation circuit 100 may omit the calculations with respect to invalid data and perform the calculations with respect to valid data based on index data in a skip calculation mode, where the index data indicates whether the internal data are the valid data or the invalid data.

In some example embodiments, the calculation circuit 100 may generate a skip enable signal SEN to control the selective omission of the calculations. Example embodiments of the calculation circuit 100 will be described below with reference to FIGS. 9 through 16.

The index data generator 200 may generate the index data ID based on write data that are stored in the memory cell array 40. Example embodiments of the index data generator 200 will be described below with reference to FIGS. 4 through 6B.

In some example embodiments, the index data ID generated by the index data generator 200 may be stored in the memory cell array 40 during a write operation to store the write data in the memory cell array 40. The index data ID stored in the memory cell array 40 may be read out from the memory cell array 40 and provided to the calculation circuit 100 in the skip calculation mode.

Figure 3:
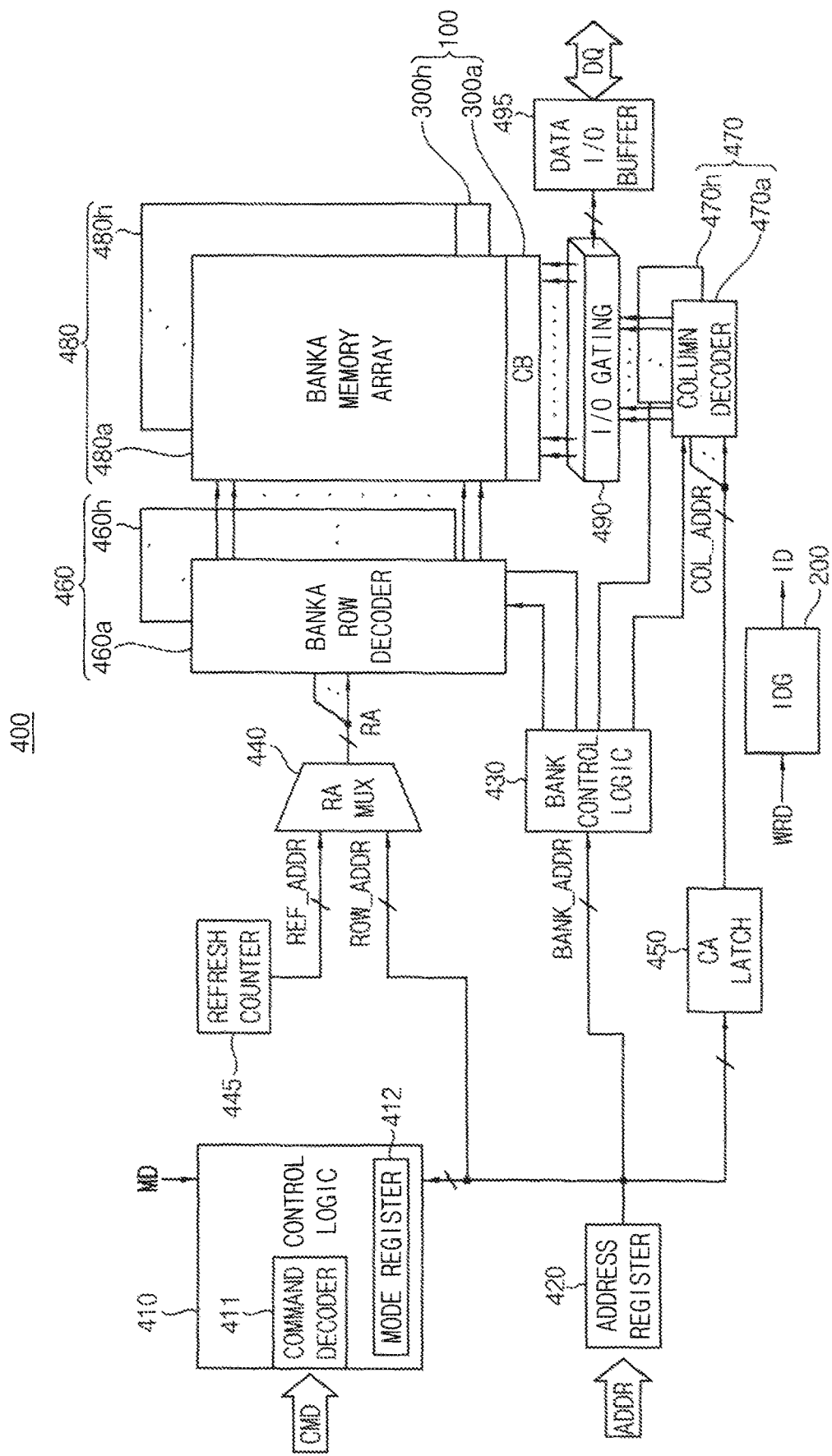
FIG. 3 is a diagram illustrating an example embodiment of a memory device included in the system of FIG. 2.

FIG. 3 is a diagram illustrating an example embodiment of a memory device included in the system of FIG. 2.

Although a DRAM is described as an example of the memory device formed in the memory semiconductor dies with reference to FIG. 3, the memory device may be any of a variety of memory cell architectures, including, but not limited to, volatile memory architectures such as DRAM, TRAM and SRAM, or non-volatile memory architectures, such as ROM, flash memory, FRAM, MRAM, and the like.

Referring to FIG. 3, a memory device 400 includes a control logic 410, an address register 420, a bank control logic 430, a row address multiplexer 440, a column address latch 450, a row decoder 460, a column decoder 470, a memory cell array 480, a calculation circuit 100, an input-output (I/O) gating circuit 490, a data input-output (I/O) buffer 495, a refresh counter 445 and an index data generator 200.

The memory cell array 480 may include a plurality of bank arrays 480a~480h. The row decoder 460 may include a plurality of bank row decoders 460a~460h respectively coupled to the bank arrays 480a~480h, the column decoder 470 may include a plurality of bank column decoders 470a~470h respectively coupled to the bank arrays 480a~480h.

The calculation circuit 100 may include a plurality of calculation blocks CB 100a~100h respectively coupled to the bank arrays 480a~480h. FIG. 3 illustrates a non-limiting example that the calculation circuit 100 is disposed between the memory cell array 480 and the input-output gating circuit 490, but the input-output gating circuit 490 may be disposed between the memory cell array 480 and the calculation circuit 100.

Each of the calculation blocks 100a~100h may include a plurality of calculation units (not shown) that receive the common broadcast data and the respective internal data from the bank arrays 480a~480h.

The index data generator 200 may generate index data ID based on write data WRD that are stored in the memory cell array 480 during a write operation.

The address register 420 may receive an address ADDR including a bank address BANK_ADDR, a row address ROW_ADDR and a column address COL_ADDR from the memory controller. The address register 420 may provide the received bank address BANK_ADDR to the bank control logic 430, may provide the received row address ROW_ADDR to the row address multiplexer 440, and may provide the received column address COL_ADDR to the column address latch 450.

The bank control logic 430 may generate bank control signals in response to the bank address BANK_ADDR. One of the bank row decoders 460a~460h corresponding to the bank address BANK_ADDR may be activated in response to the bank control signals, and one of the bank column decoders 470a~470h corresponding to the bank address BANK_ADDR may be activated in response to the bank control signals.

The row address multiplexer 440 may receive the row address ROW_ADDR from the address register 420, and may receive a refresh row address REF_ADDR from the refresh counter 445. The row address multiplexer 440 may selectively output the row address ROW_ADDR or the refresh row address REF_ADDR as a row address RA. The row address RA that is output from the row address multiplexer 440 may be applied to the bank row decoders 460a~460h.

The activated one of the bank row decoders 460a~460h may decode the row address RA that is output from the row address multiplexer 440, and may activate a word-line corresponding to the row address RA. For example, the activated bank row decoder may apply a word-line driving voltage to the word-line corresponding to the row address RA.

The column address latch 450 may receive the column address COL_ADDR from the address register 420, and may temporarily store the received column address COL_ADDR. In some example embodiments, in a burst mode, the column address latch 450 may generate column addresses that increment from the received column address COL_ADDR. The column address latch 450 may apply the temporarily stored or generated column address to the bank column decoders 470a~470h.

The activated one of the bank column decoders 470a~470h may decode the column address COL_ADDR that is output from the column address latch 450, and may control the input-output gating circuit 490 to output data corresponding to the column address COL_ADDR. The I/O gating circuit 490 may include a circuitry for gating input data and output data. The I/O gating circuit 490 may further include read data latches for storing data that is output from the bank arrays 480a~480h, and write drivers for writing data to the bank arrays 480a~480h.

Data to be read from one bank array of the bank arrays 480a~480h may be sensed by one of the bank sense amplifiers coupled to the one bank array from which the data is to be read, and may be stored in the read data latches. The data stored in the read data latches may be provided to the memory controller via the data I/O buffer 495. Data DQ to be written in one bank array of the bank arrays 480a~480h may be provided to the data I/O buffer 495 from the memory controller. The write driver may write the data DQ in one bank array of the bank arrays 480a~480h.

The control logic 410 may control operations of the memory device 400. For example, the control logic 410 may generate control signals for the memory device 400 to perform a write operation or a read operation. The control logic 410 may include a command decoder 411 that decodes a command CMD received from the memory controller and a mode register set 412 that sets an operation mode of the memory device 400. The control logic 410 may control the memory device 400 to operate selectively in a skip calculation mode or in a normal calculation mode in response to a mode signal MD.

Figure 4:
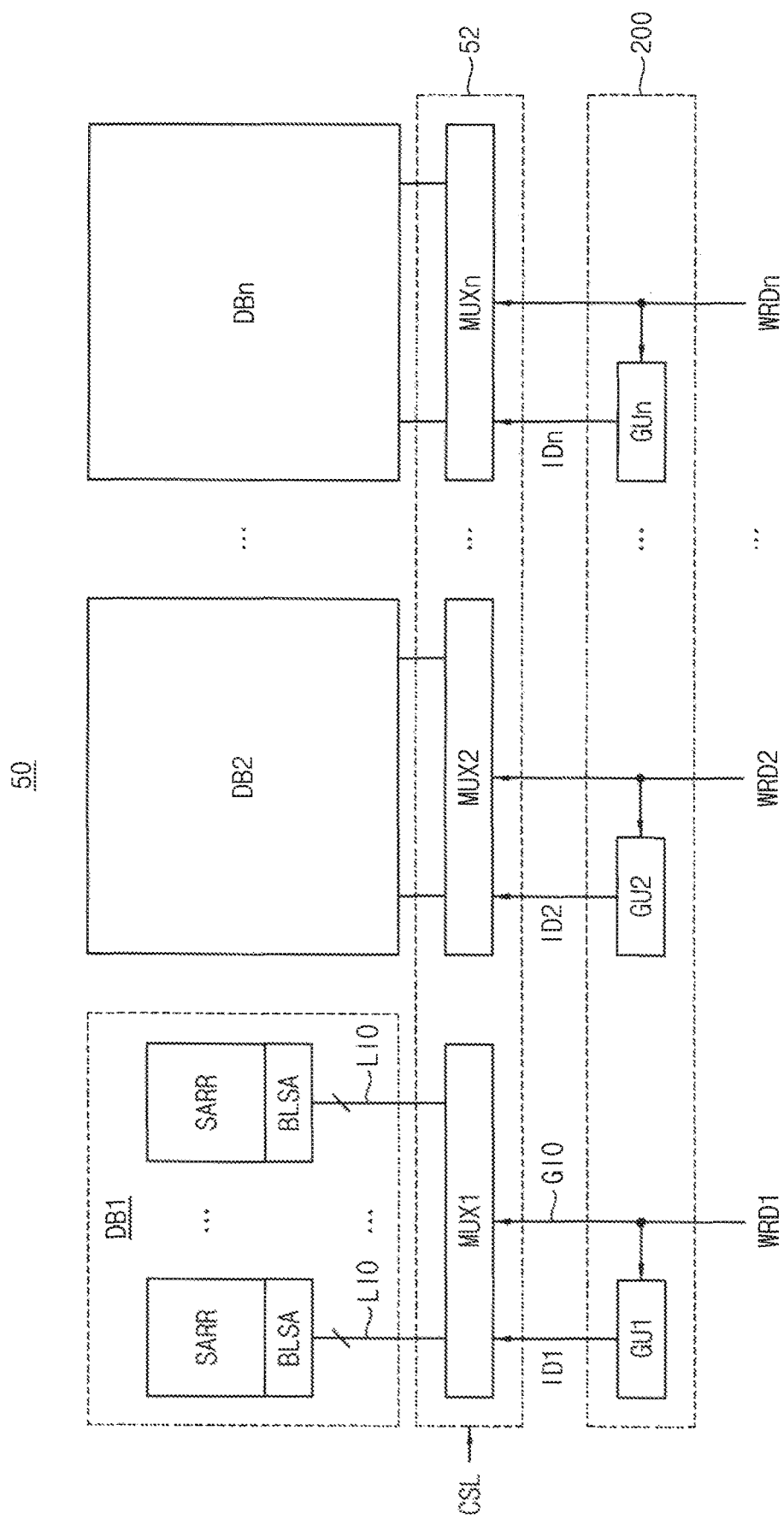
FIG. 4 is a block diagram illustrating a memory device according to example embodiments.

FIG. 4 is a block diagram illustrating a memory device according to example embodiments.

FIG. 4 is for describing a write operation and thus only components for the write operation are illustrated and other components are omitted in FIG. 4. A configuration corresponding to one memory bank is illustrated in FIG. 4 for convenience of illustration.

Referring to FIG. 4, a memory device 50 may include a plurality of data blocks DB1~DBn, an input-output gating circuit 52 and an index data generator 200. FIG. 4 illustrates a configuration of a first data block DB1 as an example and the other data blocks DB2~DBn may have the same configuration as the first data block DB1. Each data block may include a plurality of sub memory cell arrays SARR and each sub memory cell array SARR may include a plurality of memory cells. In a write operation, the data provided from the external may be stored in the memory cells sequentially via the global input-output lines GIO and the local input-output lines LIO. The hierarchical structure of the data block may be implemented variously.

The input-output gating circuit 52 may select the local input-output lines corresponding to a column address for the write data WRD1~WRDn based on a column selection signal CSL. The column selection signal CSL may be provided from the column decoder 470 as described with reference to FIG. 3. The input-output gating circuit 52 may include a plurality of switch circuits MUX1~MUXn corresponding to the plurality of data blocks DB1~DBn, respectively.

The index data generator 200 may generate the index data ID1~IDn based on the write data WRD1~WRDn that are stored in the data blocks DB1~DBn, respectively. The index data ID1~IDn may have different values depending on the write data WRD1~WRDn.

The index data generator 200 may include a plurality of generation units GUi~GUn corresponding to the plurality of data blocks DB1~DBn. Each generation unit GUi (i=1~n) may generate the respective index data IDi based on the respective write data WRDi that are stored in the corresponding data block DBi. In other words, the first generation unit GU1 may generate the first index data IDi based on the first write data WRD1 that are stored in the first data block DB1, the second generation unit GU2 may generate the second index data ID2 based on the second write data WRD2 that are stored in the second data block DB2, and in this way the n-th generation unit GUn may generate the n-th index data IDn based on the n-th write data WRDn that are stored in the n-th data block DBn. The index data ID1~IDn generated by the index data generator 200 may be stored together with the write data WRD1~WRDn in the data blocks DB1~DBn of the memory cell array during the write operation.

Figure 5:
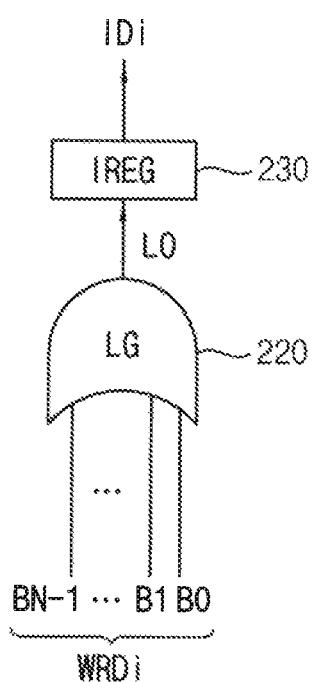
FIG. 5 is a diagram illustrating an example embodiment of a generation unit included in the index data generator in the memory device of FIG. 4.

FIG. 5 is a diagram illustrating an example embodiment of a generation unit included in the index data generator in the memory device of FIG. 4.

Referring to FIG. 5, a generation unit 210 may include a logic gate LG 220 and an index storage IREG 230. The logic gate 220 may perform a logic operation on the respective write data WRDi and the index storage 230 may store the respective index data IDi based on an output signal LO of the logic gate 220.

The respective write data IDi may include N data bits B0~BN−1, and the logic gate 2220 may generate the output signal LO by performing the logic operation on the data bits B0~BN−1 of the respective write data WRDi. In some example embodiments, the logic gate 220 may be implemented with an OR logic gate. In this case, the output signal LO may have a first value (e.g., "0") indicating that the respective write data WRDi are the invalid data when all bits B0~BN−1 of the respective write data WRDi have a value of 0 and the output signal may have a second value (e.g., "1") indicating that the respective write data WRDi are the valid data when at least one bit among all bits B0~Bn−1 of the respective write data WRDi has a value of 1.

The logic gate 220 may perform the logic operation sequentially with respect to the respective write data WRDi corresponding to a plurality of column addresses and the index storage 230 may store a plurality of index bits of the respective index data IDi sequentially based on the output signal LO of the logic gate 220.

Figure 6A:
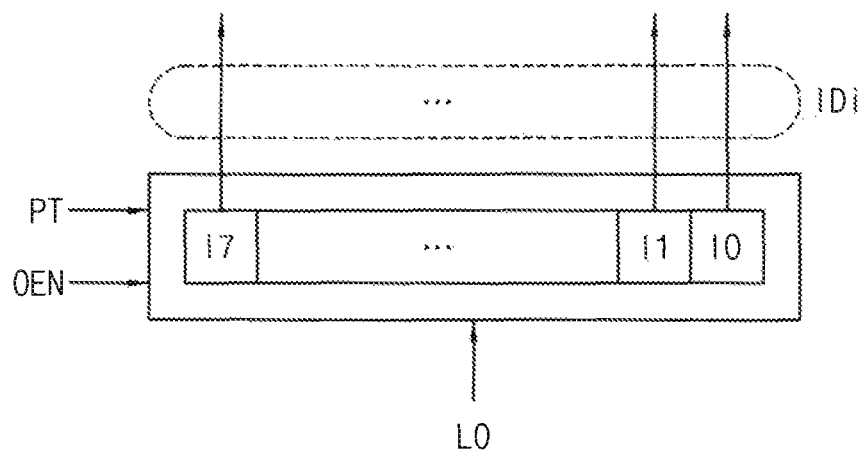
FIGS. 6A and 6B are diagrams illustrating example embodiments of an index storage included in the generation unit of FIG. 5.
Figure 6B:
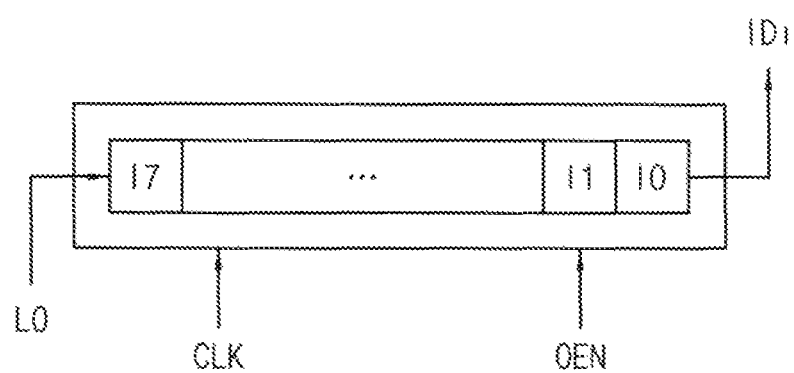

FIGS. 6A and 6B are diagrams illustrating example embodiments of an index storage included in the generation unit of FIG. 5.

Referring to FIGS. 5 and 6A, an index storage 231 may sequentially store values of the output signal LO of the logic gate 220 as a plurality of index bits I0~I7 of the index data IDi based on a pointer signal PT. The plurality of index bits I0~I7 may correspond to a plurality of column addresses and each of the index bits I0~I7 may indicate whether the internal data read from a corresponding column address are the valid data or the invalid data. The index storage 231 may output the stored index bits I0~I7 as the index data IDi in a form of a parallel signal in response to an output enable signal OEN.

Referring to FIGS. 5 and 6B, an index storage 232 may be implemented with a shift register configured to perform a shifting operation in synchronization with a clock signal CLK to sequentially store values of the output signal LO of the logic gate 220 as a plurality of index bits I0~I7 of the index data IDi. In addition, the index storage 232 may perform a shifting operation in synchronization with the clock signal CLK to output the stored index bits I0~I7 as the index data IDi in a form of a serial signal. In some example embodiments, index storage 232 may output the stored index bits I0~I7 as the index data IDi in a form of a parallel signal in response to an output enable signal OEN as described with reference to FIG. 6A.

Figure 7A:
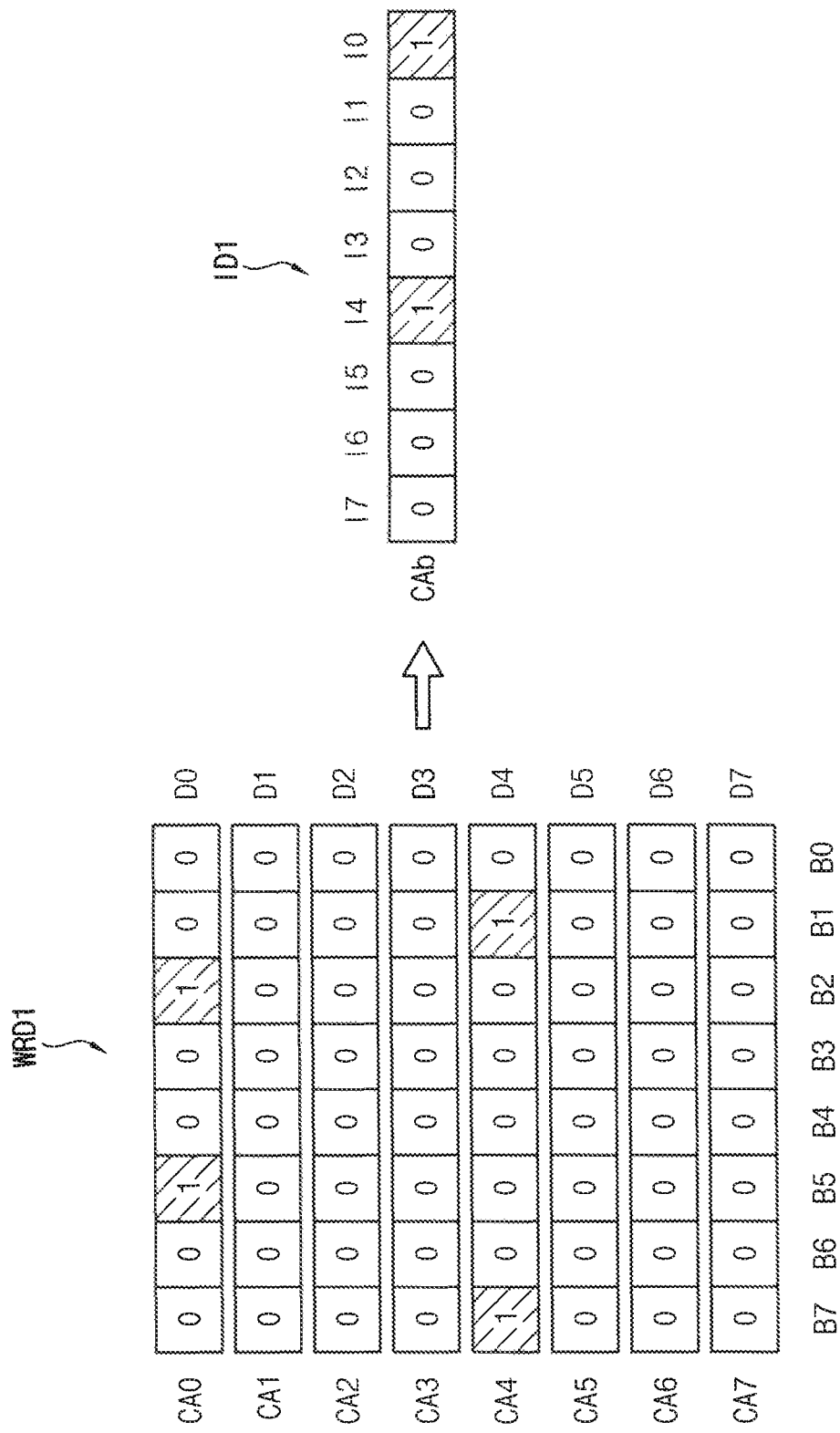
Figure 7B:
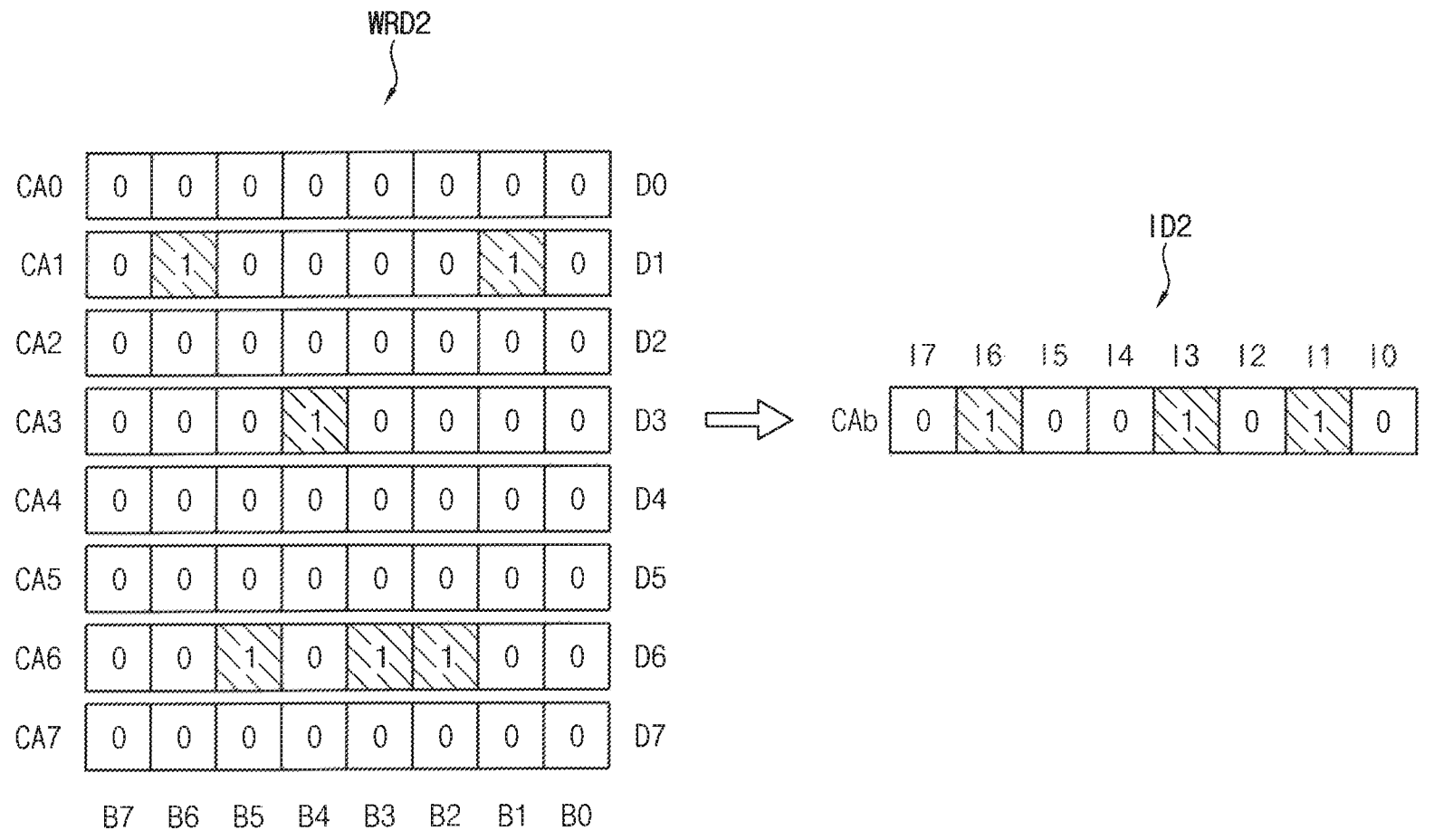

FIGS. 7A and 7B are diagrams for describing index data according to example embodiments.

FIG. 7A illustrates an example of first write data WRD1 that are stored in a first data block DB1 and first index data ID1 corresponding to the first write data WRD1 and FIG. 7B illustrates an example of second write data WRD2 that are stored in a second data block DB2 and second index data ID2 corresponding to the second write data WRD2.

Referring to FIG. 7A, the first write data WRD1 may include first through eighth column data D0~D7 that are stored at first through eighth column addresses CA0~CA7, respectively. Each of the first through eighth column data D0~D7 may include first through eighth bits B0~B7.

In case of the first write data WRD1, the first and fifth column data D0 and D4 include at least one bit having a value of "1" and all bits of the other column data D1, D2, D3, D5, D6 and D7 have a value of "0". Accordingly, the first index data ID1 as illustrated in FIG. 7A may be generated using the logic gate 220 and the index storage 230 as described with reference to FIG. 5. The first and fifth index bits I0 and I4 of the first index data ID1 have the value of "1" and the other bits I1, I2, I3, I5, I6 and I7 of the first index data ID1 have the value of "0".

The column data D0~D7 may be stored at the column addresses CA0~CA7 of the first data block DB1 and the first index data ID may be stored at a base column address CAb of the first data block DB1.

Referring to FIG. 7B, the second write data WRD2 may include first through eighth column data D0~D7 that are stored at first through eighth column addresses CA0~CA7, respectively. Each of the first through eighth column data D0~D7 may include first through eighth bits B0~B7.

In case of the second write data WRD2, the second, fourth and seventh column data D1, D3 and D6 include at least one bit having a value of "1" and all bits of the other column data D0, D2, D4, D5 and D7 have a value of "0". Accordingly, the second index data ID2 as illustrated in FIG. 7B may be generated using the logic gate 220 and the index storage 230 as described with reference to FIG. 5. The second, fourth and seventh index bits I1, I3 and I6 of the second index data ID2 have the value of "1" and the other bits I0, I2, I4, I5 and I7 of the second index data ID2 have the value of "0".

The column data D0~D7 may be stored at the column addresses CA0~CA7 of the second data block DB2 and the second index data ID2 may be stored at a base column address CAb of the second data block DB2.

Although example examples that the respective write data include the eight column data corresponding to the eight column addresses and the respective column data include the eight bits, the number of the column data in the respective write data and the number of bits in the respective column data may be determined variously.

The mapping relation between the column addresses CA0~CA7 and the corresponding base column address CAb may be determined variously. For example, the base column address may have a value of "k" and the first through eighth column addresses CA0~CA7 may have sequentially increasing values of "k+1" through "k+8".

Figure 8:
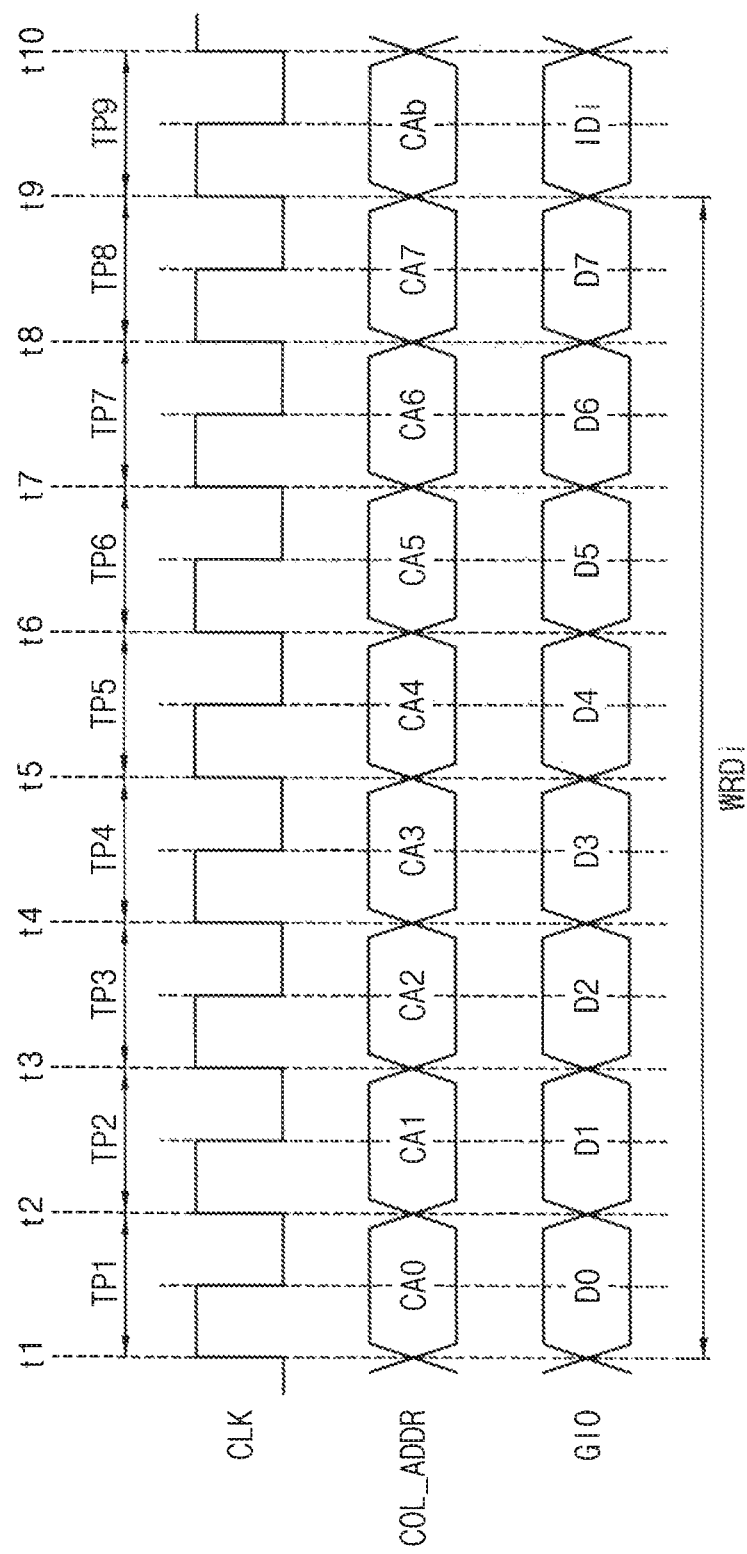
FIG. 8 is a timing diagram illustrating an example write operation of a memory device according to example embodiments.

FIG. 8 is a timing diagram illustrating an example write operation of a memory device according to example embodiments.

FIG. 8 shows that time points t1~t10 correspond to rising edges of a clock signal CLK which is for convenience of illustration and example embodiments are not limited thereto.

Referring to FIG. 8, a column address signal COL_ADDR may represent first through eight column addresses CA0~CA7 sequentially and thus first through eighth column data D0~D7 included in respective write data WRDi may be stored at the first through eight column addresses CA0~CA7 of the corresponding data block DBi during first through eighth time periods TP1~TP8. The column address signal COL_ADDR may represent a base column address CAb during a ninth time period TP9 after the respective write data WRDi are stored, and thus the respective index data IDi may be stored at the base column address CAb of the corresponding data block DBi.

Figure 9:
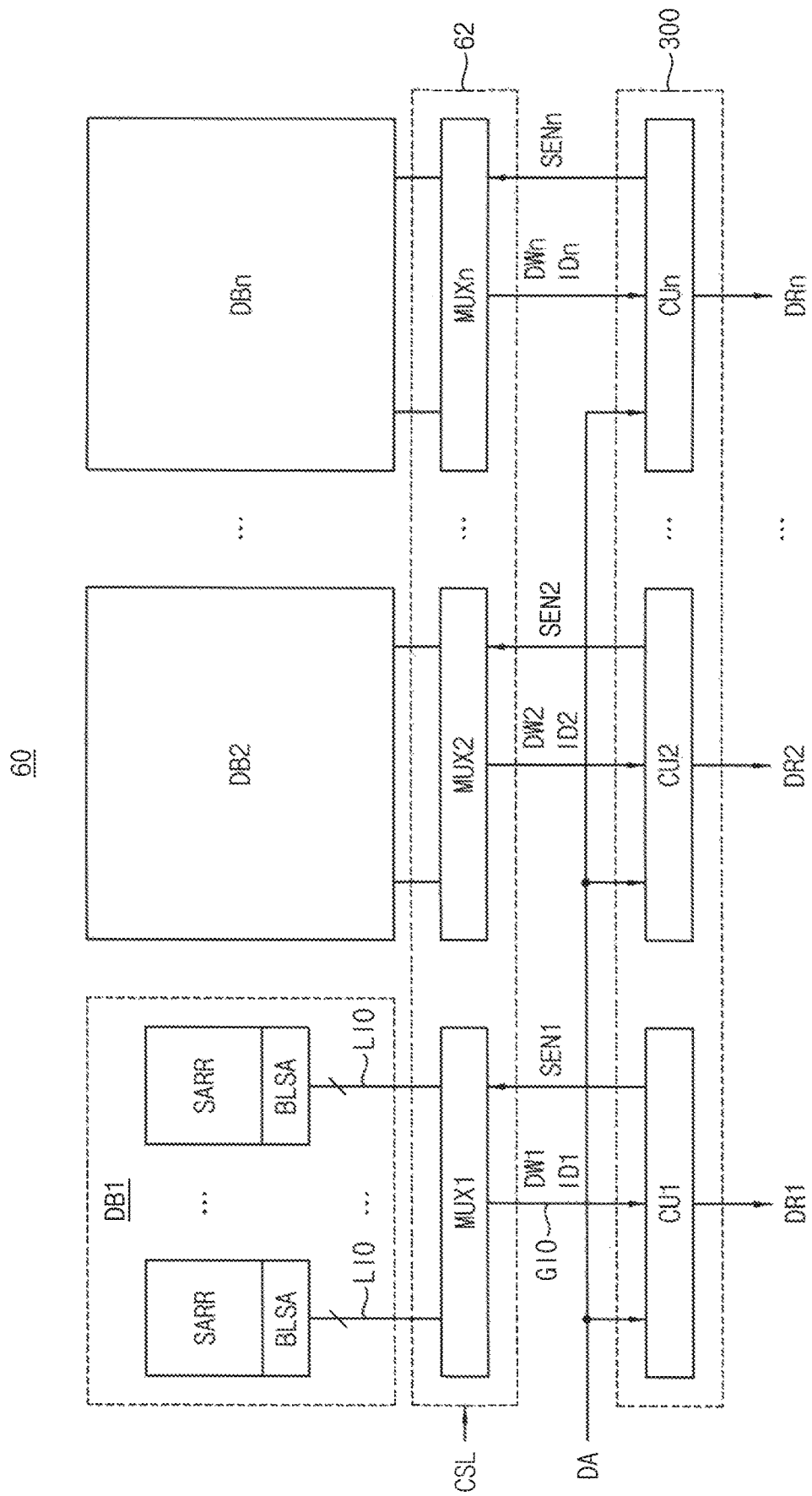
FIG. 9 is a block diagram illustrating a memory device according to example embodiments.

FIG. 9 is a block diagram illustrating a memory device according to example embodiments.

FIG. 9 is for describing a calculation operation and thus only components for the calculation operation are illustrated and other components are omitted in FIG. 9. A configuration corresponding to one memory bank is illustrated in FIG. 9 for convenience of illustration.

Referring to FIG. 9, a memory device 60 may include a plurality of data blocks DB1~DBn, an input-output gating circuit 62 and a calculation block 300. FIG. 9 illustrates a configuration of a first data block DB1 as an example and the other data blocks DB2~DBn may have the same configuration as the first data block DB1. Each data block may include a plurality of sub memory cell arrays SARR and each sub memory cell array SARR may include a plurality of memory cells. In a calculation operation, the internal data DW1~DWn read out from the data blocks DB1~DBn may be provided to the calculation block 300 sequentially via the local input-output lines LIO and the global input-output lines GIO. The hierarchical structure of the data block may be implemented variously.

The input-output gating circuit 62 may select the local input-output lines corresponding to a column address for the internal data DW1~DWn based on a column selection signal CSL. The column selection signal CSL may be provided from the column decoder 470 as described with reference to FIG. 3. The input-output gating circuit 62 may include a plurality of switch circuits MUX1~MUXn corresponding to the plurality of data blocks DB1~DBn, respectively.

The calculation block 300 may include a plurality of calculation units CU1~CUn corresponding to the plurality of data blocks DB1~DBn. FIG. 9 illustrates that each calculation unit is assigned to each data block as an example and each calculation unit may be disposed per two or more data blocks. Each of the calculation units CU1~CUn may receive the common broadcast data DA and the respective internal data DW1~DWn read from each of the data blocks DB1~DBn. The calculation units CU1~CUn may perform the calculations based on the broadcast data DA and the respective internal data DW1~DWn to provide calculation result data DR1~DRn, respectively.

As will be described below, the calculation units CU1~CUn may generate a plurality of skip enable signals SEN1~SENn independently based on the respective index data ID1~IDn in the skip calculation mode. The skip enable signals SEN1~SENn may be provided to the corresponding switch circuits MUX1~MUXn of the input-output gating circuit 62. Each of the switch circuits MUX1~MUXn may output the valid data from the corresponding data block when the corresponding skip enable signal is activated and block the invalid data from the corresponding data block when the corresponding skip enable signal is deactivated.

Figure 10:
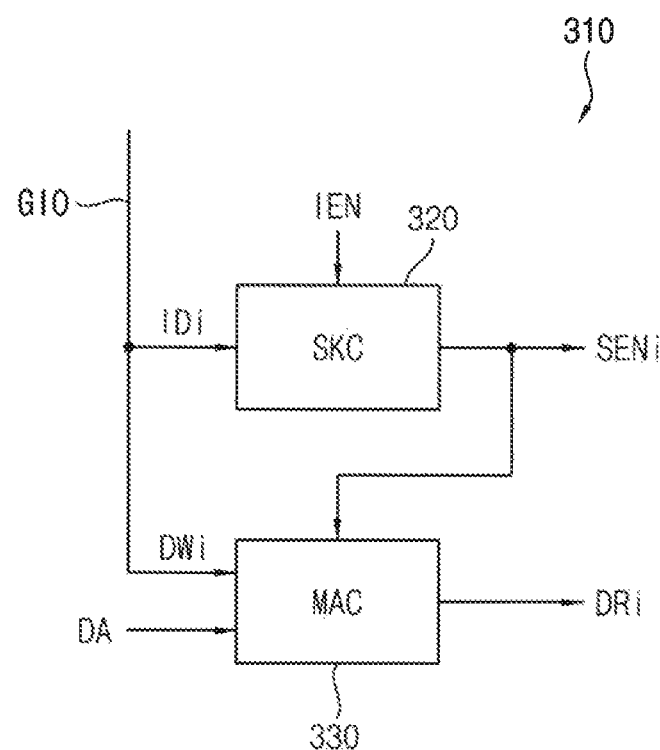
FIG. 10 is a diagram illustrating an example embodiment of a calculation unit included in the calculation circuit in the memory device of FIG. 9.

FIG. 10 is a diagram illustrating an example embodiment of a calculation unit included in the calculation circuit in the memory device of FIG. 9.

Referring to FIG. 10, a calculation unit 310 may include a skip controller SKC 320 and a calculator MAC 330.

The skip controller 320 may generate a respective skip enable signal SENi based on respective index data IDi corresponding to the respective internal data DWi. As will be described below with reference to FIGS. 13A and 13B, the skip controller 320 may receive the respective index data IDi in response to an activation of an index enable signal IEN.

The calculator 330 may perform the calculations based on the broadcast data DA and the respective internal data DWi and omit the invalid data of the respective internal data DWi based on the respective skip enable signal SENi in the skip calculation mode.

As will be described below with reference to FIGS. 13A and 13B, based on the respective index data IDi in the skip calculation mode, the skip controller 320 may activate the respective skip enable signal SENi when the respective internal data DWi are read from the column address corresponding to the valid data and deactivates the respective skip enable signal SENi when the respective internal data DWi are read from the column address corresponding to the invalid data. The calculator 330 may be enabled to perform the calculations based on the broadcast data DA and the valid data when the respective skip enable signal SENi is activated and the calculator 330 may be disabled when the respective skip enable signal SENi is deactivated.

As will be described below with reference to FIG. 14, the skip controller 320 may activate the respective skip enable signal SENi regardless of the respective index data IDi in a normal calculation mode.

Figure 11:
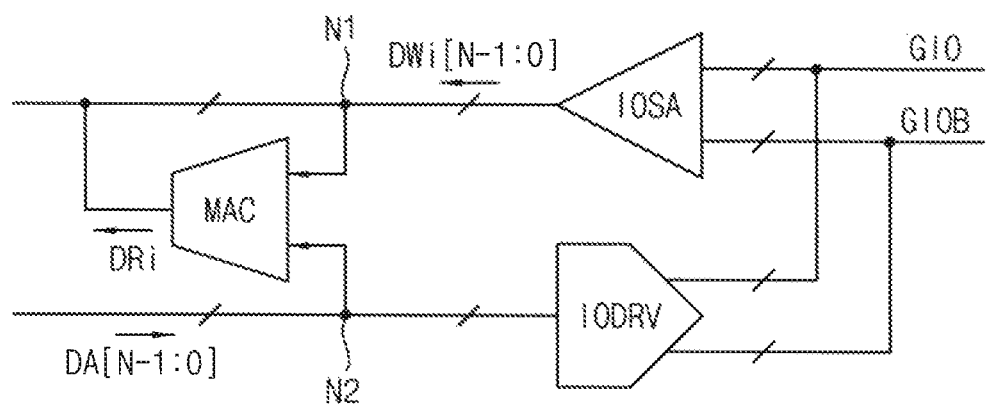
FIG. 11 is a diagram illustrating an example disposition of a calculator included in the calculation unit of FIG. 10.

FIG. 11 is a diagram illustrating an example disposition of a calculator included in the calculation unit of FIG. 10.

Referring to FIG. 11, a calculation MAC may include first input terminals connected to first nodes N1 receiving the respective internal data DWi[N−1:0] and second input terminals connected to second nodes N2 receiving the broadcast data DA[N−1:0]. The first nodes N1 are connected to output terminals of an input-output sense amplifier IOSA that amplifies signals on global input-output lines GIO and GIOB to output amplified signals and the second nodes N2 are connected to input terminals of an input-output driver IODRV that drives the global input-output lines GIO and GIOB.

During a normal read operation, the calculator MAC is disabled and the input-output sense amplifier IOSA amplifies the read data provided through the global input-output lines GIO and GIOB to provide the amplified signals to the external. During a normal write operation, the calculator MAC is disabled and the input-output driver IODRV drives the global input-output lines GIO and GIOB based on the write data provided from the external. During a calculation operation, the calculator MAC is enabled to receive the broadcast data DA[N−1:0] and the respective internal data DWi[N−1:0]. In this case, the input-output sense amplifier IOSA is enabled to output the respective internal data DWi[N−1:0] and the input-output driver IODRV is disabled to prevent the broadcast data DA[N−1:0] from being provided to the internal memory cells.

In some example embodiments, as illustrated in FIG. 11, the output terminals of the calculator MAC providing respective calculation result data DRi may be connected to the first nodes N1, that is, the output terminals of the input-output sense amplifiers IOSA. Thus the respective calculation result data DRi may be provided to the external through the normal read path. The input-output sense amplifier IOSA is disabled while the calculation unit CU provides the respective calculation result data DRi. In other example embodiments, the output terminals of the calculator MAC may not be connected to the first nodes N1 and the respective calculation result data DRi may be provided through an additional data path distinct from the normal read path. In still other example embodiments, the output nodes of the calculator MAC may be connected to the second nodes N2 to store the respective calculation result data DRi in the memory cells through the normal write path.

FIG. 11 illustrates a differential global line pair GIO and GIOB for convenience of illustration but each calculator MAC may be connected to N global line pairs to receive N-bit broadcast data DA[N−1:0] and N-bit respective internal data DWi[N−1:0]. For example, N may be 8, 16 or 21 depending on operation modes of the stacked memory device.

Figure 12:
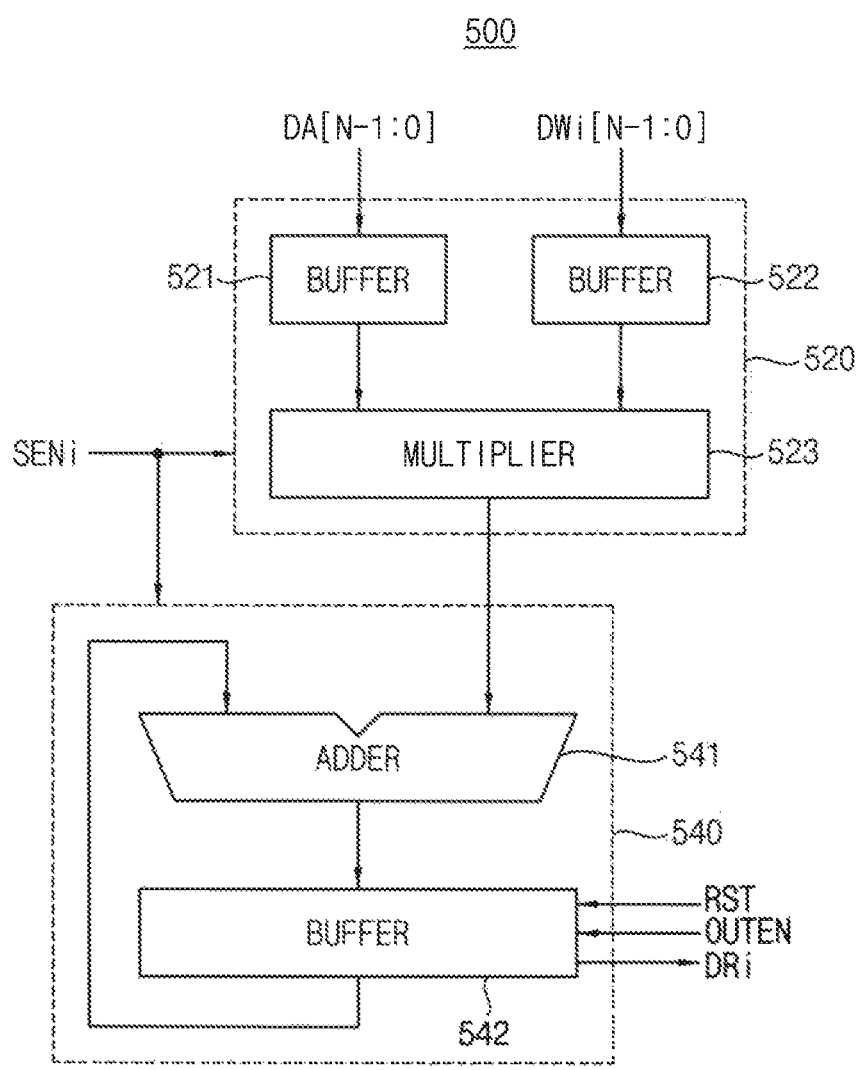
FIG. 12 is a diagram illustrating an example embodiment of a calculator included in the calculation unit of FIG. 10.

FIG. 12 is a diagram illustrating an example embodiment of a calculator included in the calculation unit of FIG. 10.

Referring to FIG. 12, each calculator 500 may include a multiplication circuit 520 and an accumulation circuit 540. The multiplication circuit 520 may include buffers 521 and 522 and a multiplier 523 configured to multiply the broadcast data DA[N−1:0] and the respective internal data DWi[N−1:0]. The accumulation circuit 540 may include an adder 541 and a buffer 542 to accumulate outputs of the multiplication circuit 520 to provide the respective calculation result data DRi. The accumulation circuit 540 may be initialized in response to a reset signal RST and output the respective calculation result data DRi in response to an output enable signal OUTEN. Using the calculator 500 as illustrated in FIG. 11, a matrix calculation may be performed efficiently as will be described with reference to FIG. 16.

The calculator 500 may be enabled selectively in response to the respective skip enable signal SENi. The calculator 500 may be enabled to perform the calculations based on the broadcast data DA and the respective internal data DWi[N−1:0] corresponding to the valid data when the respective skip enable signal SENi is activated and the calculator 500 may be disabled when the respective skip enable signal SENi is deactivated.

Figure 13A:
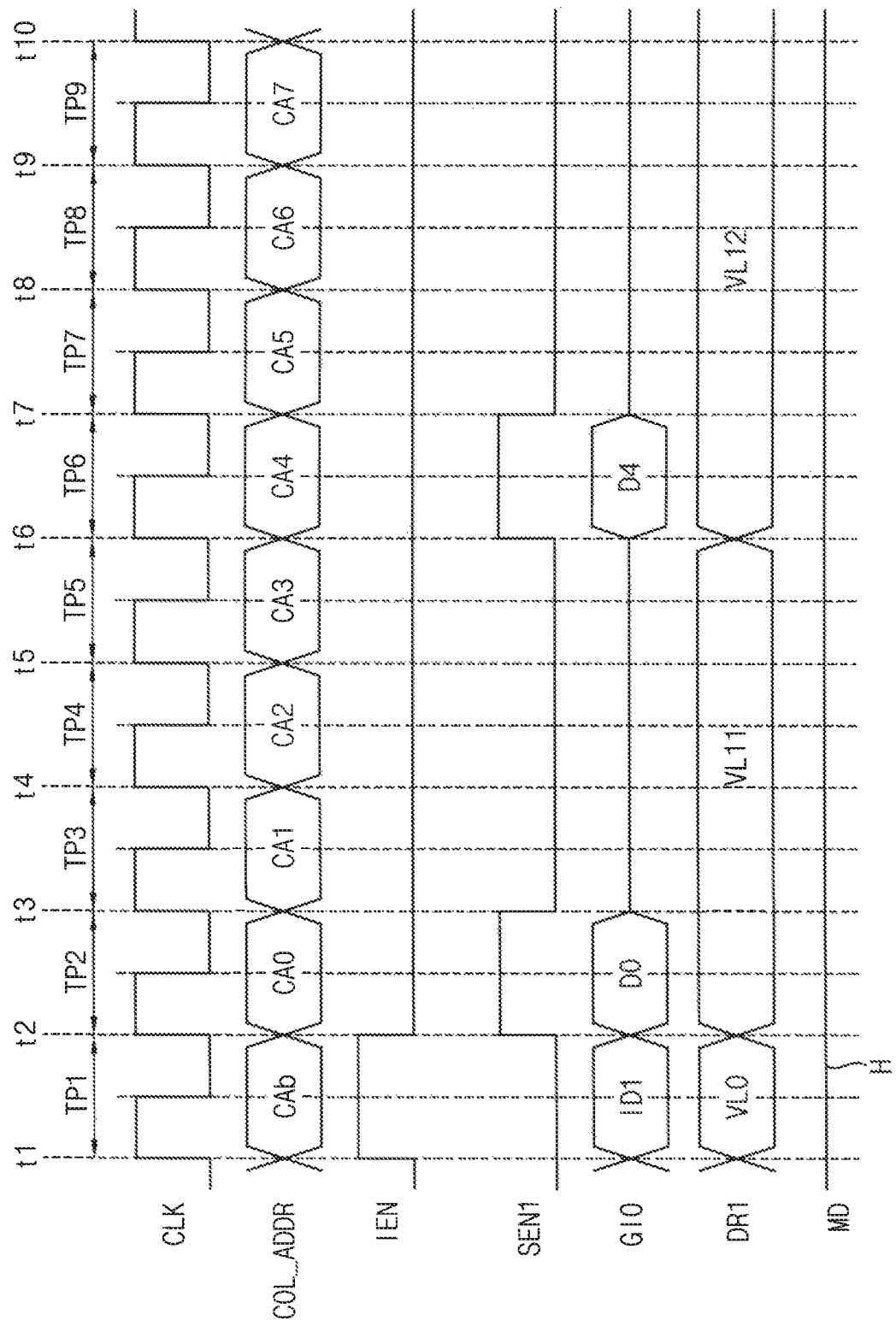
FIGS. 13A and 13B are timing diagrams illustrating an example operation of a skip calculation mode in a memory device according to example embodiments.
Figure 13B:
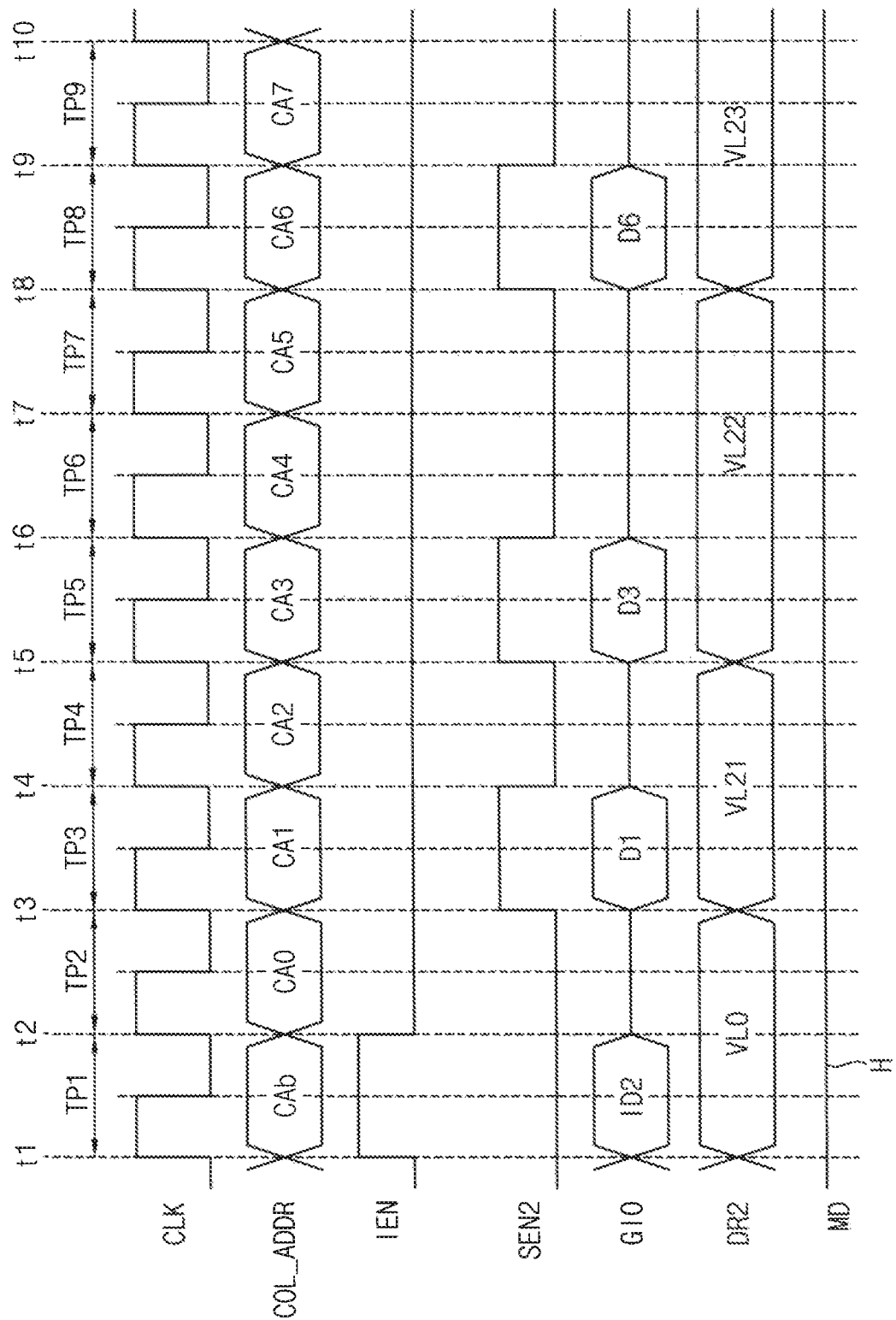
Figure 14:
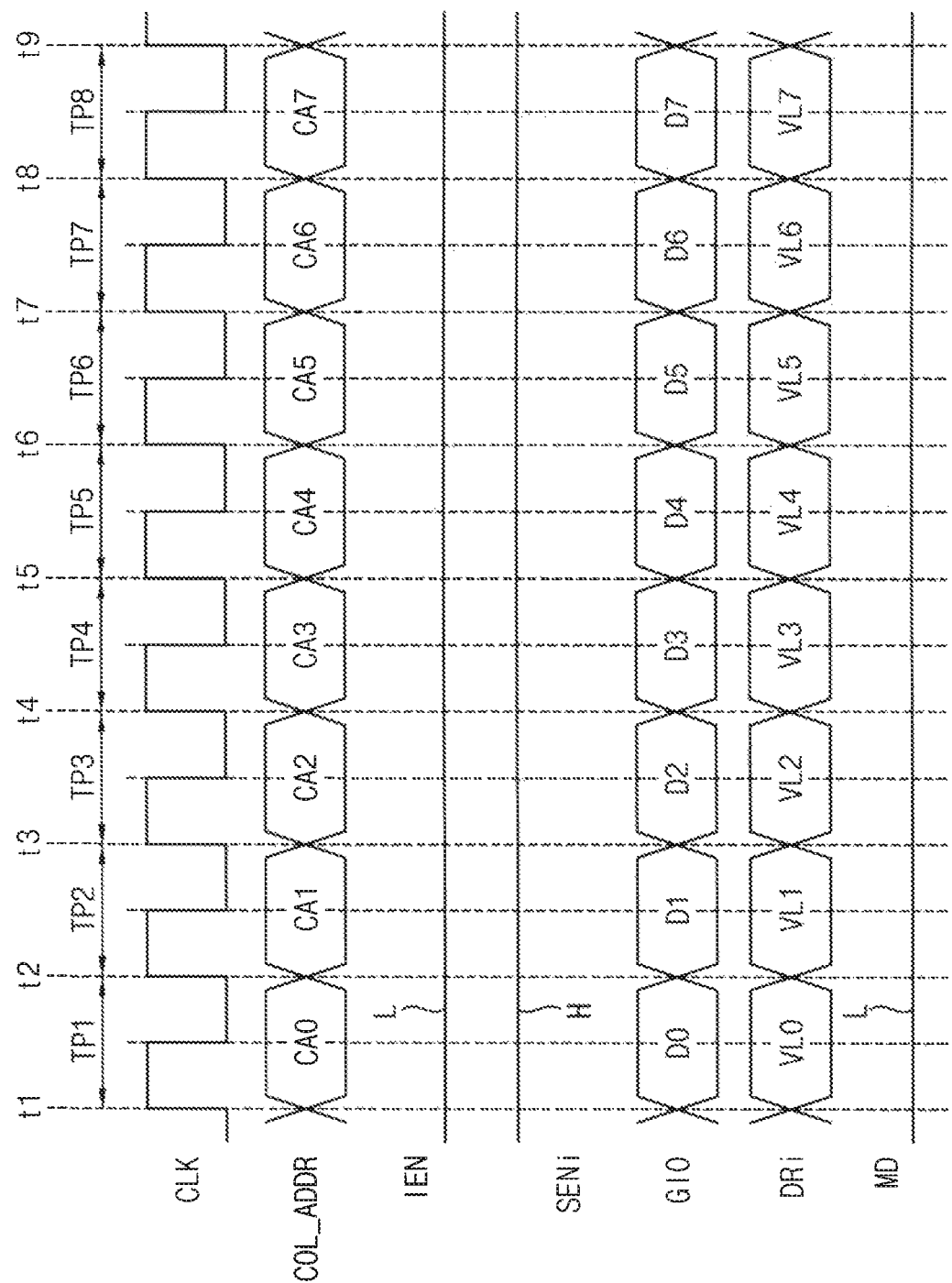
FIG. 14 is a timing diagram illustrating an example operation of a normal calculation mode in a memory device according to example embodiments.

FIGS. 13A and 13B are timing diagrams illustrating an example operation of a skip calculation mode in a memory device according to example embodiments, and FIG. 14 is a timing diagram illustrating an example operation of a normal calculation mode in a memory device according to example embodiments.

FIGS. 13A, 13B and 14 show that time points t1~t10 correspond to rising edges of a clock signal CLK which is for convenience of illustration and example embodiments are not limited thereto. For example, a logic high level H of a mode signal MD may represent the skip calculation mode and a logic low level L of the mode signal MD may represent the normal calculation mode.

FIG. 13A illustrates a skip calculation operation of the first data block DB1 based on the first internal data identical to the first write data WDR1 as illustrated in FIG. 7A, and FIG. 13A illustrates a skip calculation operation of the second data block DB2 based on the second internal data identical to the second write data WDR2 as illustrated in FIG. 7B.

Referring to FIG. 13A, the column address signal COL_ADDR may sequentially represent a base column address CAb and first through eighth column addresses CA0~CA7. An index enable signal IEN may be activated during a first time period TP1 and the skip controller 320 in FIG. 10 may receive the first index data ID1 in response to the activation of the index enable signal IEN. The skip controller 320 may generate the first skip enable signal SEN1 based on the first index data ID1 as illustrated in FIG. 7A such that the first skip enable signal SEN1 may be activated during second and sixth time periods TP2 and TP6. Based on the first skip enable signal SEN1, only the first and fifth column data D0 and D4 may be output through the global input-output lines GIO from the first data block DB1 and the other column data D1, D2, D3, D5, D6 and D7 may not be output. In addition, the first calculation result data DR1 may have values VL0, VL11 and VL12 that are updated at the time points t2 and t6 as illustrated in FIG. 13A because the calculator 330 in FIG. 10 performs the calculations with respect to only the first and fifth column data D0 and D4.

Referring to FIG. 13B, the column address signal COL_ADDR may sequentially represent a base column address CAb and first through eighth column addresses CA0~CA7. An index enable signal IEN may be activated during a first time period TP1 and the skip controller 320 in FIG. 10 may receive the second index data ID2 in response to the activation of the index enable signal IEN. The skip controller 320 may generate the second skip enable signal SEN2 based on the second index data ID2 as illustrated in FIG. 7B such that the second skip enable signal SEN2 may be activated during third, fifth and eighth time periods TP3, TP5 and TP8. Based on the second skip enable signal SEN2, only the second, fourth and seventh column data D1, D3 and D6 may be output through the global input-output lines GIO from the second data block DB2 and the other column data D0, D2, D4, D5 and D7 may not be output. In addition, the second calculation result data DR2 may have values VL0, VL21, VL22 and VL23 that are updated at the time points t3, t5 and t8 as illustrated in FIG. 13B because the calculator 330 in FIG. 10 performs the calculations with respect to only the second, fourth and seventh column data D1, D3 and D6.

Referring to FIG. 14, the column address signal COL_ADDR may sequentially represent first through eighth column addresses CA0~CA7. An index enable signal IEN may be deactivated in the logic low level L and the respective skip enable signal SENi may be activated in the logic high level H always in the normal calculation mode. Based on the activated respective skip enable signal SENi, all of the first through eighth column data D0~D7 may be sequentially output from the respective data block DBi through the global input-output lines GIO. The respective calculation result data DRi may have values VL0~VL7 that are sequentially updated at the time points t2~t8 as illustrated in FIG. 14 because the calculator 330 in FIG. 10 performs the calculations with respect to all of the first through eighth column data D0~D7.

Figure 15:
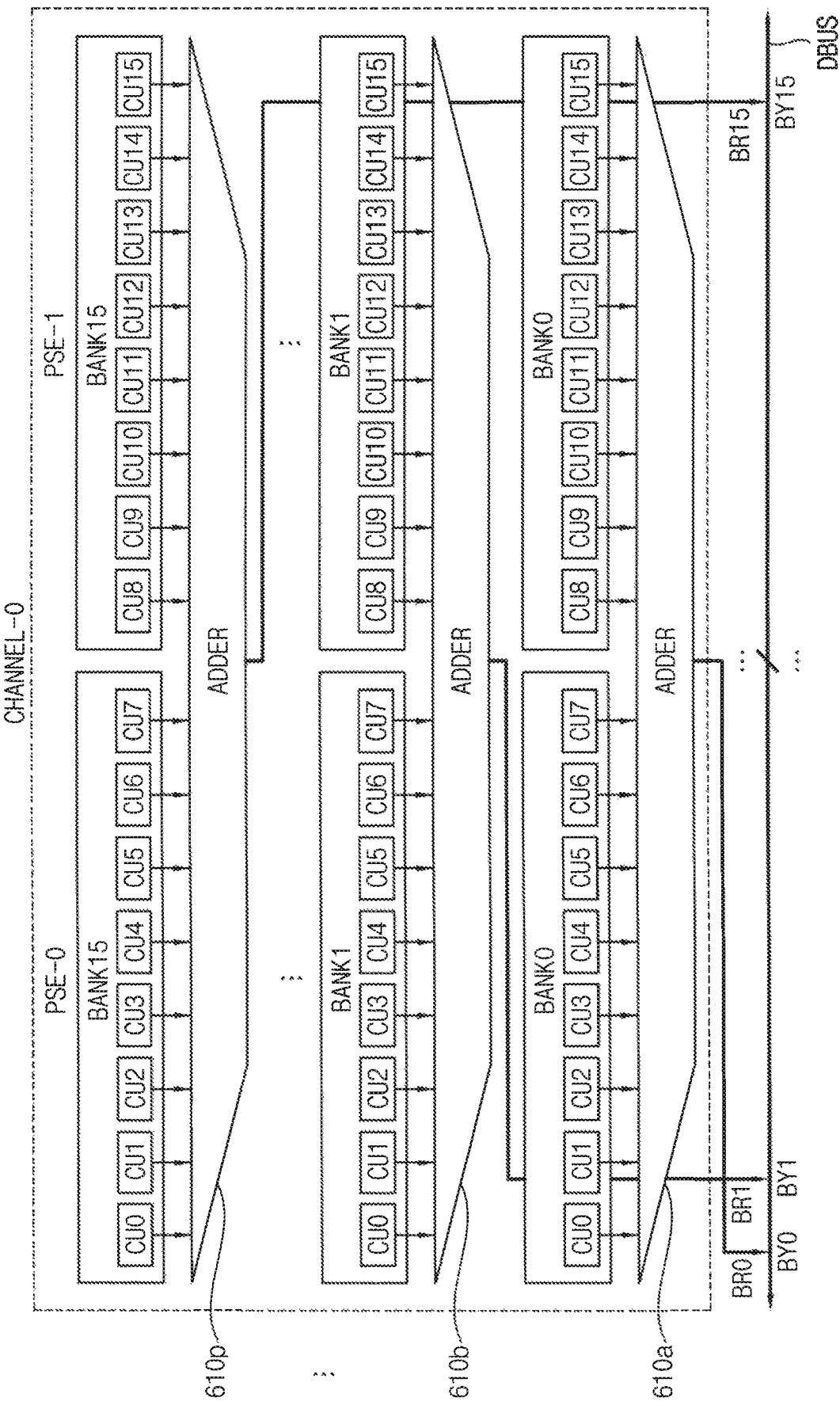
FIG. 15 is a diagram illustrating an example embodiment of outputting calculation result data.

FIG. 15 is a diagram illustrating an example embodiment of outputting calculation result data.

FIG. 15 illustrates outputting the calculation result data corresponding to one channel CHANNEL-0. The one channel CHANNEL-0 may include a plurality of memory banks BANK0~BANK15, and each of the memory banks BANK0~BANK15 may include a plurality of calculation units CU0~CU15. The memory banks BANK0~BANK15 may be divided by two pseudo-channels PSE-0 and PSE-1.

Each of a calculation semiconductor dies in which the calculation units are formed may further include a plurality of bank adders 610a~610p. Each of the bank adders 610a~610p may sum outputs of the calculation units CU0~CU15 in each of the memory banks BANK0~BANK15 to generate each of bank result signals BR0~BR15. The bank result signals BR0~BR15 may be output simultaneously through the data bus DBUS corresponding to each calculation semiconductor die. For example, if the data bus corresponding to the one calculation semiconductor die has a data width of 128 bits and the one channel CHANNEL-0 includes sixteen memory banks BANK0~BANK15, the output of each bank adder may be output through data paths of 8 bits or one byte of the data bus DBUS. In other words, the bank result signal BR0 of the first bank adder 610*a* may be output through the data paths corresponding to the first byte BY0 of the data bus DBUS, the bank result signal BR1 of the second bank adder 610*b* may be output through the data paths corresponding to the second byte BY1 of the data bus DBUS, and in this way the bank result signal BR15 of the sixteenth bank adder 610*p* may be output through data paths corresponding to the sixteenth byte BY15 of the data bus DBUS.

Figure 16:
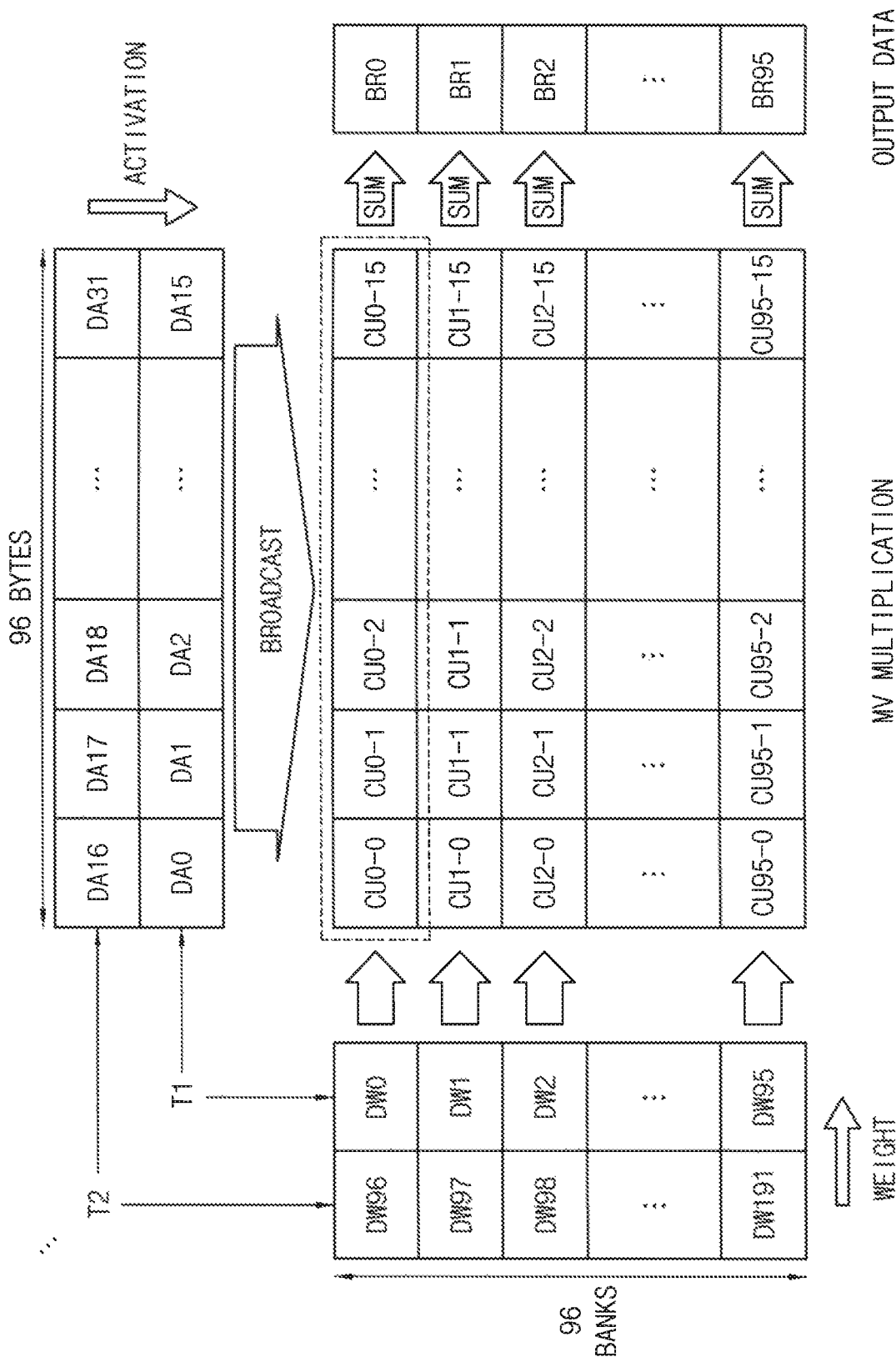
FIG. 16 is a diagram illustrating a matrix calculation using a calculation circuit according to example embodiments.

FIG. 16 is a diagram illustrating a matrix calculation using a calculation circuit according to example embodiments.

FIG. 16 illustrates a matrix-vector multiplication that is performed using calculation units CU0-0 through CU95-15 in a stacked memory device according to example embodiments. In FIG. 16, the calculation units Cui-0 through Cui-15 of the i-th row (i=1~95) correspond to the i-th memory bank BANKi. For example, the matrix-vector multiplication may be a 32-bit mode and each memory bank may include sixteen calculation units. It is assumed that each of the four memory semiconductor dies includes two channels and each channel includes sixteen memory banks. In this case, if the one memory semiconductor die is used as the above-described input-output semiconductor die and the other three memory semiconductor dies are used as the above-described calculation semiconductor dies, the number of the memory banks included in the calculation semiconductor dies may be 96, that is, 6 channels*16 memory banks.

The first set of the broadcast data DA0~DA15 during the first period T1 and the second set of the broadcast data DA16~DA31 are sequentially provided to all calculation unit in all memory banks. As such, activations may be broadcast sequentially. Also the first set of the internal data DW0~DW95 during the first period T1 and the second set of the internal data DW96~DW191 as weights are sequentially provided to the calculation unit. The internal data correspond to the data read from the respective memory banks. As such, the calculation units may perform dot product operations based on the activations and the weights that are provided sequentially. The calculation units in the same memory bank provide partial sums of the same output activation. Accordingly, after the dot product operations are completed, the partial sums may be summed again by the bank adders in FIG. 16 to provide the final result as the bank result signals BR0~BR95.

The matrix-vector multiplication as illustrated in FIG. 16 may correspond to a 1*1 convolution or a fully-connected layer. In case of MLP and RNN, the broadcast data or the broadcast activations correspond to a sub-array of one-dimensional input activation. In case of CNN, the input activation corresponds to 1*1 sub-column of input activation tensor.

Figure 17:
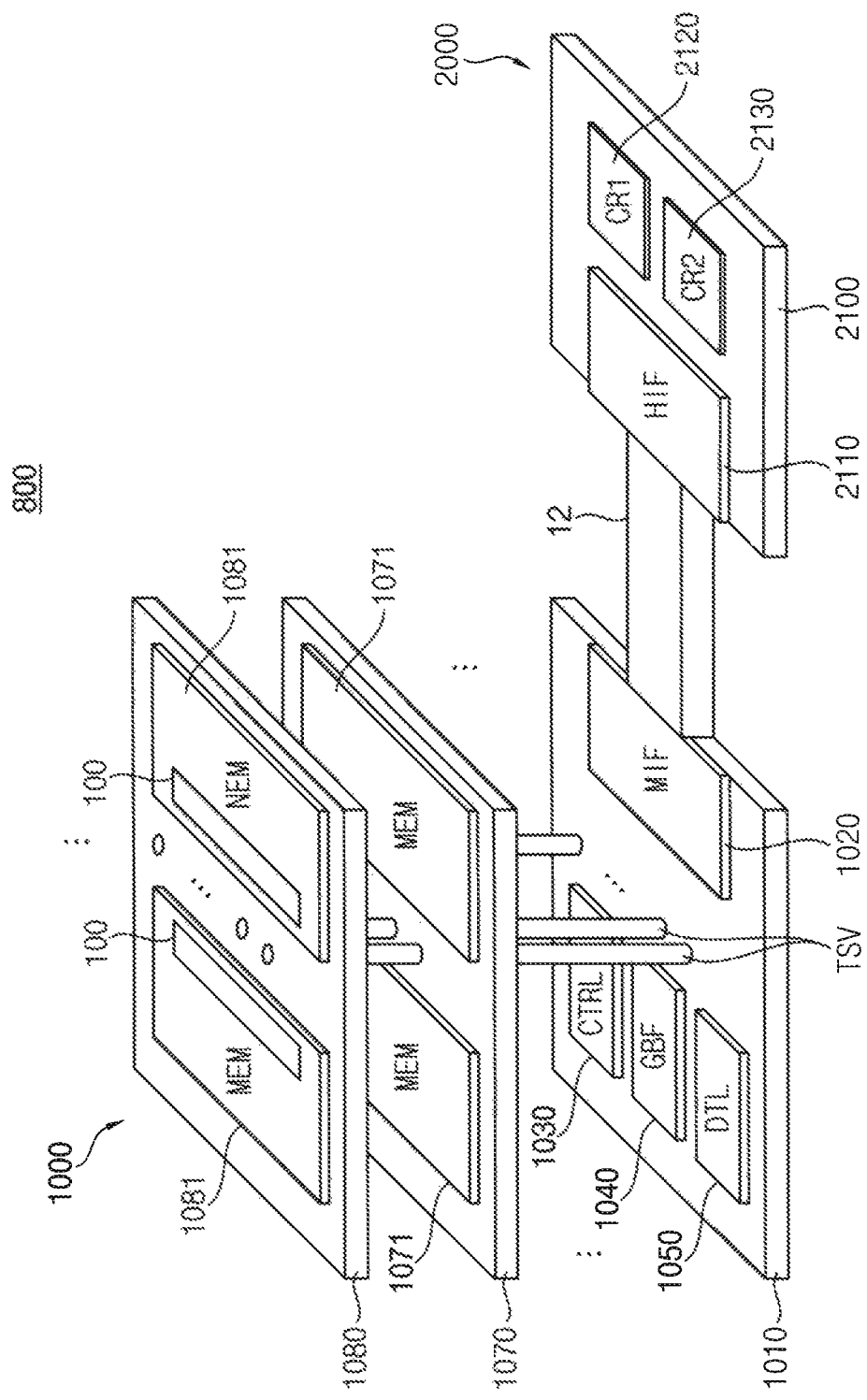
FIG. 17 is an exploded, perspective view of a system including a stacked memory device according to example embodiments.

FIG. 17 is an exploded, perspective view of a system including a stacked memory device according to example embodiments.

Referring to FIG. 17, a system 800 includes a stacked memory device 1000 and a host device 2000.

The stacked memory device 1000 may include a base semiconductor die or a logic semiconductor die 1010 and a plurality of memory semiconductor dies 1070 and 1080 stacked with the logic semiconductor die 1100. FIG. 17 illustrates a non-limiting example of one logic semiconductor die and two memory semiconductor dies. Two or more logic semiconductor dies and one, three or more memory semiconductor dies may be included in the stack structure. In addition, FIG. 17 illustrates a non-limiting example in that the memory semiconductor dies 1070 and 1080 are vertically stacked with the logic semiconductor die 1010. As will be described below with reference to FIG. 19, the memory semiconductor dies 1070 and 1080 except for the logic semiconductor die 1010 may be stacked vertically and the logic semiconductor die 1010 may be electrically connected to the memory semiconductor dies 1070 and 1080 through an interposer and/or a base substrate.

The logic semiconductor die 1010 may include a memory interface MIF 1020 and a logic to access memory integrated circuits 1071 and 1081 formed in the memory semiconductor dies 1070 and 1080. Such logic may include a control circuit CTRL 1030, a global buffer GBF 1040 and a data transform logic DTL 1050.

The memory interface 1020 may perform communication with an external device such as the host device 2000 through an interconnect device 12. The control circuit 1030 may control overall operations of the stacked memory device 1000. The data transform logic 1050 may perform logic operations on data exchanged with the memory semiconductor dies 1070 and 1080 or data exchanged through the memory interface 1020. For example, the data transform logic may perform max pooling, rectified linear unit (ReLU) operation, channel-wise addition, etc.

The memory semiconductor dies 1070 and 1080 may include the memory integrated circuits 1071 and 1081, respectively. At least one of the memory semiconductor dies 1070 and 1080 may be a calculation semiconductor die 1080 that includes a calculation circuit 100. As will be described below, the calculation circuit 100 may include one or more calculation blocks and each of the calculation blocks may include one or more calculation units. Each of the calculation units may perform each of calculations based on broadcast data and internal data to provide calculation result data. The broadcast data may be provided commonly to the calculation semiconductor dies through the through-silicon vias TSV, and the internal data may be read from the memory integrated circuit of the corresponding calculation semiconductor die.

The host device 2000 may include a host interface HIF 2110 and processor cores CR1 2120 and CR2 2130. The host interface 2110 may perform communication with an external device such as the stacked memory device 1000 through the interconnect device 12.

Figure 18:
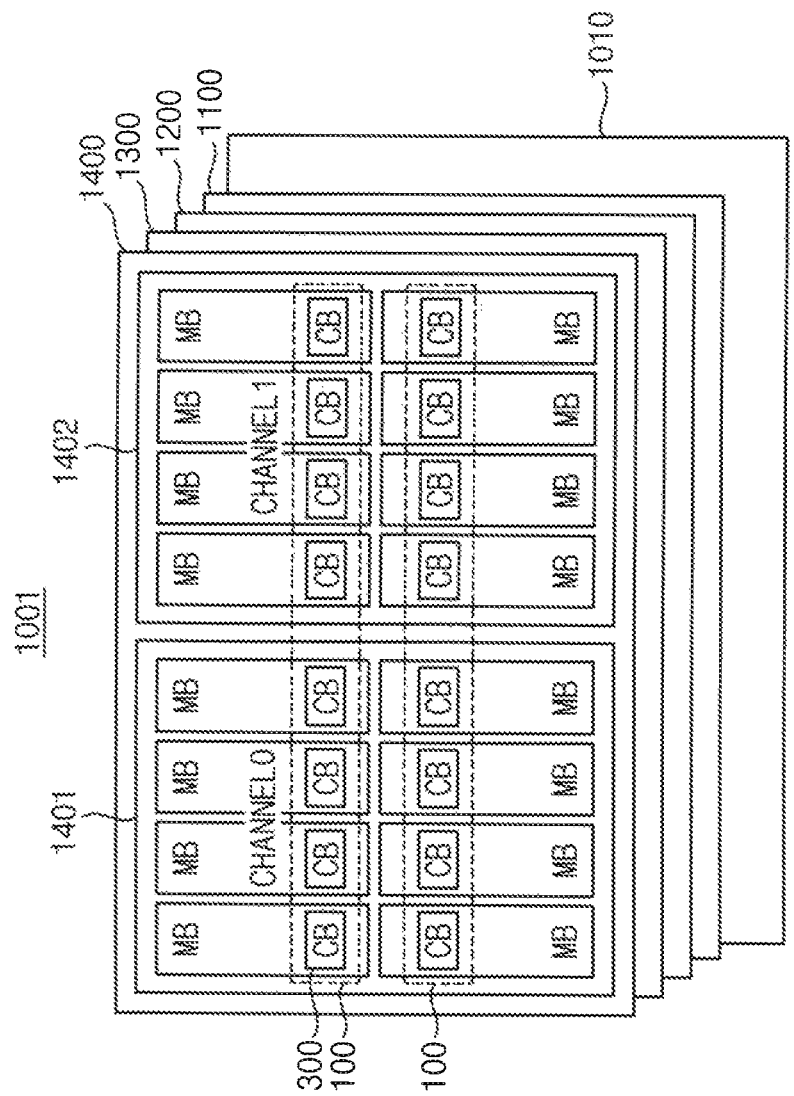
FIG. 18 is a diagram illustrating an example high bandwidth memory (HBM) organization.

FIG. 18 is a diagram illustrating an example high bandwidth memory (HBM) organization.

Referring to FIG. 18, a HBM 1001 may include a stack of multiple DRAM semiconductor dies 1100, 1200, 1300 and 1400. The HBM of the stack structure may be optimized by a plurality of independent interfaces called channels. Each DRAM stack may support up to 8 channels in accordance with the HBM standards. FIG. 3 shows an example stack containing 4 DRAM semiconductor dies 1100, 1200, 1300 and 1400, and each DRAM semiconductor die supports two channels CHANNEL0 and CHANNEL1. For example, as illustrated in FIG. 4, the fourth memory semiconductor die 1400 may include two memory integrated circuits 1401 and 1402 corresponding to the two channels.

The fourth memory semiconductor die 1400, for example, may correspond to the calculation semiconductor die including the calculation units. Each of the memory integrated circuits 1401 and 1402 may include a plurality of memory banks MB, and each memory bank MB may include a calculation block CB 300. As described above, a calculation circuit 100 may include a plurality of calculation blocks 300 and each calculation block 300 may include a plurality of calculation units CU. As such, the calculation units may be disposed distributively in the memory banks 300 of the calculation semiconductor die.

Each channel provides access to an independent set of DRAM banks. Requests from one channel may not access data attached to a different channel. Channels are independently clocked, and need not be synchronous. Each of the memory semiconductor dies 1100, 1200, 1300 and 1400 of the HBM 1001 may access the other memory semiconductor die for transfer of the broadcast data and/or the calculation result data.

The HBM 1001 may further include an interface die 1010 or a logic semiconductor die disposed at bottom of the stack structure to provide signal routing and other functions. Some function for the DRAM semiconductor dies 1100, 1200, 1300 and 1400 may be implemented in the interface die 1010.

Figure 19:
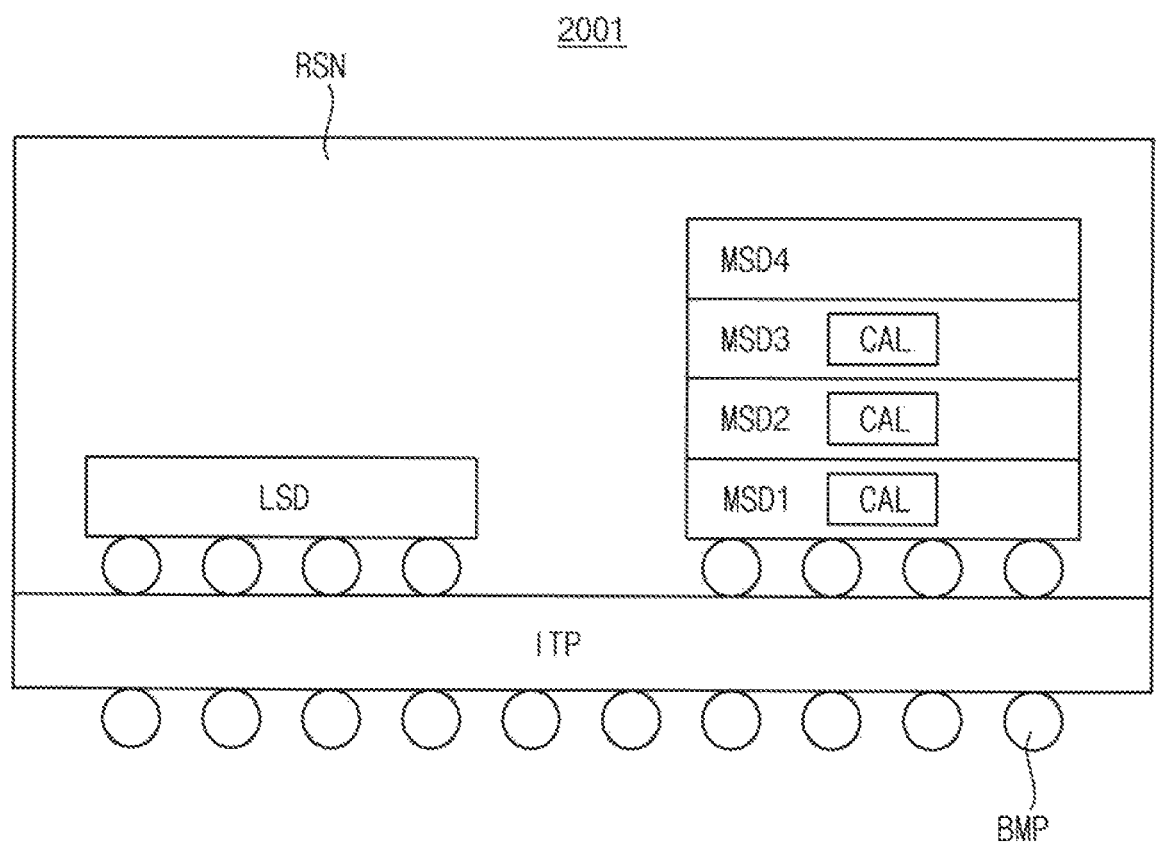
FIGS. 19 and 20 are diagrams illustrating packaging structures of a stacked memory device according to example embodiments.
Figure 20:
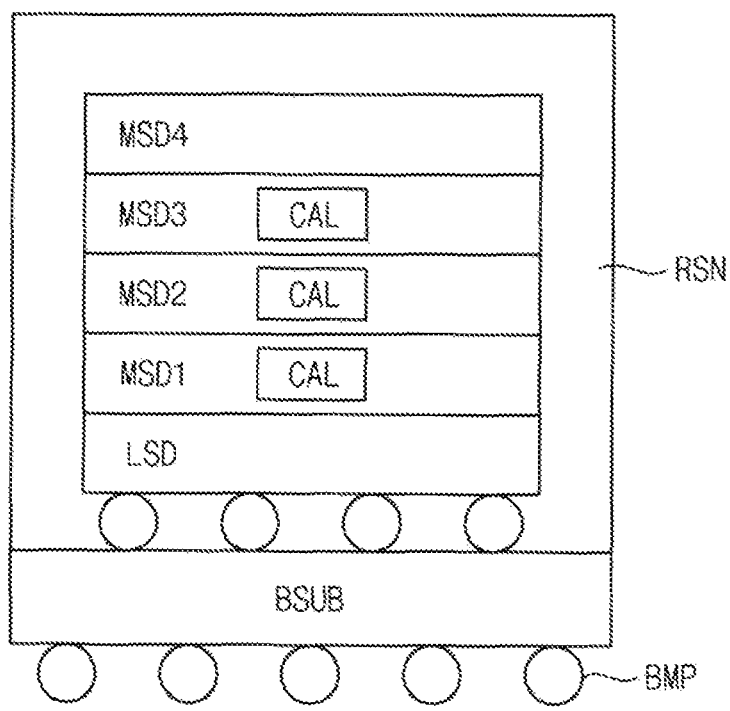

FIGS. 19 and 20 are diagrams illustrating packaging structures of a stacked memory device according to example embodiments.

Referring to FIG. 19, a memory chip 2001 may include an interposer ITP and a stacked memory device stacked on the interposer ITP. The stacked memory device may include a logic semiconductor die LSD and a plurality of memory semiconductor dies MSD1~MSD4.

Referring to FIG. 20, a memory chip 2002 may include a base substrate BSUB and a stacked memory device stacked on the base substrate BSUB. The stacked memory device may include a logic semiconductor die LSD and a plurality of memory semiconductor dies MSD1~MSD4.

FIG. 19 illustrates a structure in which the memory semiconductor dies MSD1~MSD4 except for the logic semiconductor die LSD are stacked vertically and the logic semiconductor die LSD is electrically connected to the memory semiconductor dies MSD1~MSD4 through the interposer ITP or the base substrate. In contrast, FIG. 20 illustrates a structure in which the logic semiconductor die LSD is stacked vertically with the memory semiconductor dies MSD1~MSD4.

As described above, at least one of the memory semiconductor dies MSD1~MSD4 may the calculation semiconductor die including the calculation circuit CAL. The calculation circuits CAL may include a plurality of calculation units that perform the calculations based on the common broadcast data and the respective internal data.

The base substrate BSUB may be the same as the interposer ITP or include the interposer ITP. The base substrate BSUB may be a printed circuit board (PCB). External connecting elements such as conductive bumps BMP may be formed on a lower surface of the base substrate BSUB and internal connecting elements such as conductive bumps may be formed on an upper surface of the base substrate BSUB. In the example embodiment of FIG. 19, the logic semiconductor die LSD and the memory semiconductor dies MSD1~MSD4 may be electrically connected through the through-silicon vias. The stacked semiconductor dies LSD and MSD1~MSD4 may be packaged using resin RSN.

Figure 21:
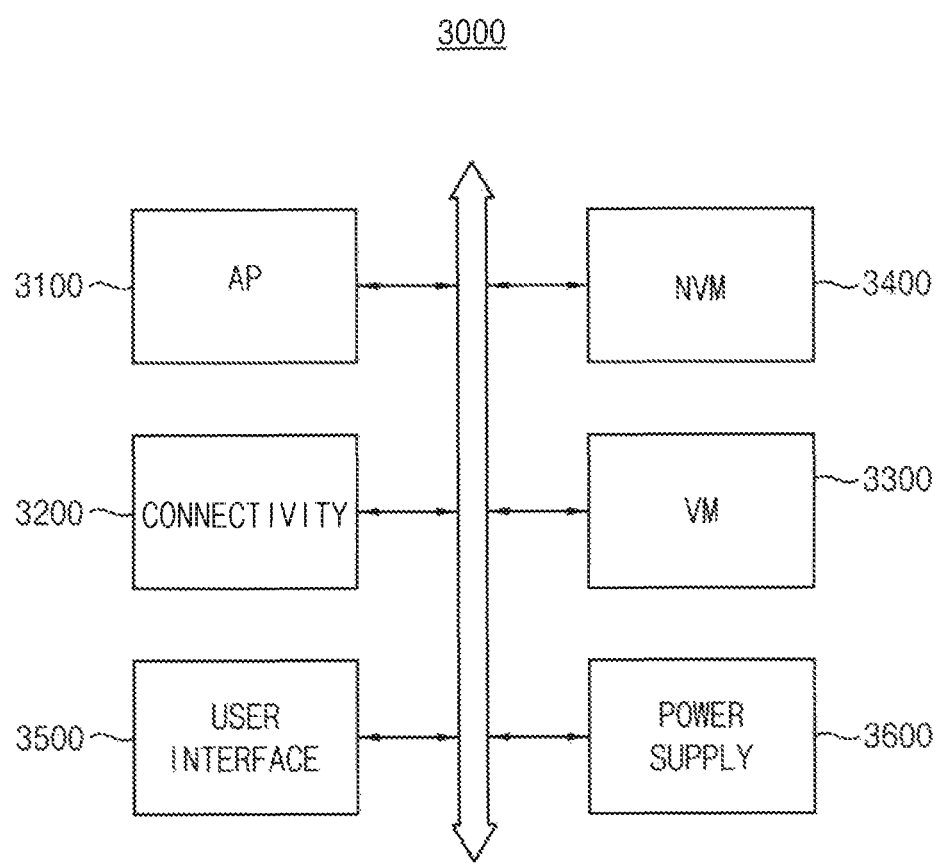
FIG. 21 is a block diagram illustrating a mobile system according to example embodiments.

FIG. 21 is a block diagram illustrating a mobile system according to example embodiments.

Referring to FIG. 21, a mobile system 3000 includes an application processor 3100, a connectivity unit 3200, a volatile memory device VM 3300, a nonvolatile memory device NVM 3400, a user interface 3500, and a power supply 3600 connected via a bus.

The application processor 3100 may execute applications such as a web browser, a game application, a video player, etc. The connectivity unit 3200 may perform wired or wireless communication with an external device. The volatile memory device 3300 may store data processed by the application processor 3100, or may operate as a working memory. For example, the volatile memory device 3300 may be a DRAM, such as a double data rate synchronous dynamic random access memory (DDR SDRAM), low power DDR (LPDDR) SDRAM, graphics DDR (GDDR) SDRAM, Rambus DRAM (RDRAM), etc. The nonvolatile memory device 3400 may store a boot image for booting the mobile system 3000 and other data. The user interface 3500 may include at least one input device, such as a keypad, a touch screen, etc., and at least one output device, such as a speaker, a display device, etc. The power supply 3600 may supply a power supply voltage to the mobile system 3000. In an example embodiment of the inventive concepts, the mobile system 3000 may further include a camera image processor (CIS), and/or a storage device, such as a memory card, a solid state drive (SSD), a hard disk drive (HDD), a compact disc read only memory (CD-ROM), etc.

The volatile memory device 3300 and/or the nonvolatile memory device 3400 may be implemented in a stacked structure as described with reference to FIGS. 17 through 20. The stacked structure may include a plurality of memory semiconductor dies connected through the through-silicon vias and above-described calculation units are formed in at least one of the memory semiconductor dies.

As described above, the memory device and the method of operating the memory device according to example embodiments may reduce data amounts exchanged between the stacked memory device, the logic semiconductor die and the external device to reduce a data processing time and power consumption by performing memory-intensive or data intensive data processing in parallel by the plurality of calculation units included in the memory semiconductor die.

In addition, the memory device and the method of operating the memory device according to example embodiments may reduce power consumption by omitting the calculations and the read operation with respect to the invalid data through the skip calculation mode based on the index data.

Example embodiments of the present inventive concepts may be applied to any devices and systems including a memory device. For example, example embodiments of the present inventive concepts may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

According to one or more example embodiments, the units and/or devices described above including elements of the semiconductor memory device 30 such as the index data generator (IDG) 200 and the calculator circuit (CAL) 100 and sub-elements thereof such as the generation unit 210 and calculation unit 310, respectively, may be implemented using hardware, a combination of hardware and software, or a non-transitory storage medium storing software that is executable to perform the functions of the same.

Hardware may be implemented using processing circuitry such as, but not limited to, one or more processors, one or more Central Processing Units (CPUs), one or more controllers, one or more arithmetic logic units (ALUs), one or more digital signal processors (DSPs), one or more microcomputers, one or more field programmable gate arrays (FPGAs), one or more System-on-Chips (SoCs), one or more programmable logic units (PLUs), one or more microprocessors, one or more Application Specific Integrated Circuits (ASICs), or any other device or devices capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, etc., capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., one or more processors, CPUs, controllers, ALUs, DSPs, microcomputers, microprocessors, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor. In another example, the hardware device may be an integrated circuit customized into special purpose processing circuitry (e.g., an ASIC).

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Software and/or data may be embodied permanently or temporarily in any type of storage media including, but not limited to, any machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including tangible or non-transitory computer-readable storage media as discussed herein.

Storage media may also include one or more storage devices at units and/or devices according to one or more example embodiments. The one or more storage devices may be tangible or non-transitory computer-readable storage media, such as random access memory (RAM), read only memory (ROM), a permanent mass storage device (such as a disk drive), and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the storage media, the computer programs, program code, instructions, or some combination thereof, may be specially designed and constructed for the purposes of the example embodiments, or they may be known devices that are altered and/or modified for the purposes of example embodiments.

The foregoing is illustrative of example embodiments and is not to be construed as limiting thereof. Although a few example embodiments have been described, those skilled in the art will readily appreciate that many modifications are possible in the example embodiments without materially departing from the present inventive concepts.

What is claimed is:

1. A memory device comprising:
 a memory cell array associated with a semiconductor die, the memory cell array including a plurality of memory cells arranged in a plurality of columns, the plurality of memory cells configured to store internal data; and
 processing circuitry associated with the semiconductor die, the processing circuitry configured to,
    receive broadcast data broadcast to the semiconductor die from outside the semiconductor die,
    read the internal data from the memory cell array,
    read index data that includes a plurality of index bits each associated with a respective one of the plurality of columns such that the plurality of index bits each indicate whether the internal data read from the respective one of the plurality of columns is invalid data or valid data, and
    selectively perform, in a skip calculation mode, calculations using the broadcast data and the internal data as inputs to generate a calculation result, based on whether the index data indicates that the internal data for the respective one of the plurality of columns is the invalid data or the valid data.

2. The memory device of claim 1, wherein, in the skip calculation mode, the memory device is configured to output the valid data from the memory cell array and to not output the invalid data from the memory cell array.

3. The memory device of claim 1, wherein, in a normal calculation mode, the processing circuitry is configured to perform the calculations on both the valid data and the invalid data regardless of the index data.

4. The memory device of claim 1, wherein
respective ones of the plurality of index bits have a first value indicating that the internal data are the invalid data when all bits of the internal data read from the respective one of the plurality of column addresses have a value of 0, and
respective ones of the plurality of index bits have a second value indicating that the internal data are the valid data when at least one bit of the internal data read from the respective one of the plurality of column addresses has a value of 1.

5. The memory device of claim 1, wherein
the memory cell array includes a plurality of data blocks, and
the processing circuitry is configured to receive the broadcast data commonly, and to receive the internal data read from a corresponding one of the plurality of data blocks.

6. The memory device of claim 5, wherein the processing circuitry is configured to,
generate respective skip enable signals based on the index data corresponding to the internal data, and
perform the calculations based on the broadcast data and the internal data such that the processing circuitry is configured to omit the invalid data of the internal data based on the respective skip enable signal in the skip calculation mode.

7. The memory device of claim 6, wherein, based on the index data in the skip calculation mode, the processing circuitry is configured to,
activate the respective skip enable signal in response to the internal data corresponding to the valid data, and
deactivate the respective skip enable signal in response to the internal data corresponding to the invalid data.

8. The memory device of claim 7, wherein the processing circuitry is configured to,
perform the calculations based on the broadcast data and the valid data in response to the respective skip enable signal being activated,
omit the calculations in response the respective skip enable signal being deactivated.

9. The memory device of claim 7, further comprising:
an input-output gating circuit configured to gate data input to and output from the memory cell array such that the input-output gating circuit,
outputs the valid data from a corresponding one of the plurality of data blocks in response to the respective skip enable signal being activated, and
blocks the invalid data from a corresponding one of the plurality of data blocks in response to the respective skip enable signal being deactivated.

10. The memory device of claim 6, wherein the processing circuitry is configured to read a respective bit of the index data from a base column address, the base column address being mapped to the column addresses of the respective internal data.

11. The memory device of claim 6, wherein the processing circuitry is configured to activate the respective skip enable signal regardless of the index data in a normal calculation mode.

12. The memory device of claim 6, wherein the processing circuitry is configured to independently generate a plurality of skip enable signals based on respective bits of the index data in the skip calculation mode.

13. The memory device of claim 1, wherein the processing circuitry is configured to generate the index data based on write data stored in the memory cell array.

14. The memory device of claim 13, wherein
the memory cell array includes a plurality of data blocks and
the processing circuitry is configured to generate respective index data based on respective ones of the write data stored in a corresponding one of the plurality of data blocks.

15. The memory device of claim 14, wherein the processing circuitry is configured to,
perform a logic operation on respective ones of the write data to generate an output signal; and
store the respective index data based on the output signal.

16. The memory device of claim 15, wherein the processing circuitry is configured to,
perform the logic operation sequentially with respect to the respective write data corresponding to a plurality of column addresses, and
store a plurality of index bits of the respective index data sequentially based on the output signal.

17. The memory device of claim 13, wherein the index data is stored in the memory cell array during a write operation of storing the write data in the memory cell array.

18. A memory device comprising:
a plurality of memory semiconductor dies stacked in a vertical direction;
through-silicon vias electrically connecting the plurality of memory semiconductor dies;
a plurality of memory integrated circuits (ICs) associated with respective ones of the plurality of memory semiconductor dies, the plurality of memory ICs including a plurality of memory cells arranged in a plurality of columns, the plurality of memory cells configured to store data; and
processing circuitry associated with one or more calculation semiconductor dies among the plurality of memory semiconductor dies, the processing circuitry configured to,
receive broadcast data, from outside the calculation semiconductor dies, commonly broadcast to the calculation semiconductor dies through the through-silicon vias,
read internal data from the memory cell array,
read index data that includes a plurality of index bits each associated with a respective one of the plurality of columns such that the plurality of index bits each indicate whether the internal data read from the respective one of the plurality of columns is invalid data or valid data, and
selectively perform, in a skip calculation mode, calculations using the broadcast data and internal data as inputs to generate a calculation result, based on whether the index data indicates that the internal data for the respective one of the plurality of columns is the invalid data or the valid data.

19. A method of operating a memory device, the memory device including a semiconductor die having a memory cell array and processing circuitry associated therewith, the method comprising:
  receiving broadcast data broadcast to the semiconductor die from outside the semiconductor die;
  reading internal data from the memory cell array;
  receiving index data that includes a plurality of index bits each associated with a respective one of the plurality of columns such that the plurality of index bits each indicate whether the internal data read from the respective one of the plurality of columns is valid data or invalid data in a skip calculation mode; and
  selectively performing, via the processing circuitry, calculations using the broadcast data and the internal data as inputs to generate a calculation result, in the skip calculation mode based on whether the index data indicates that the internal data for the respective one of the plurality of columns is the invalid data or the valid data.

* * * * *